(12) United States Patent
Wieland et al.

(10) Patent No.: US 8,445,869 B2
(45) Date of Patent: May 21, 2013

(54) PROJECTION LENS ARRANGEMENT

(75) Inventors: Marco Jan-Jaco Wieland, Delft (NL); Alexander Hendrik Vincent Van Veen, Rotterdam (NL)

(73) Assignee: Mapper Lithography IP B.V., Delft (NL)

( * ) Notice: Subject to any disclaimer, the term of this patent is extended or adjusted under 35 U.S.C. 154(b) by 205 days.

(21) Appl. No.: 12/905,126

(22) Filed: Oct. 15, 2010

(65) Prior Publication Data

US 2012/0091358 A1   Apr. 19, 2012

Related U.S. Application Data

(63) Continuation of application No. PCT/EP2009/054467, filed on Apr. 15, 2009.

(60) Provisional application No. 61/045,243, filed on Apr. 15, 2008.

(51) Int. Cl.
*H01J 37/10* (2006.01)
*H01J 37/147* (2006.01)
*H01J 37/30* (2006.01)

(52) U.S. Cl.
USPC ........................................ 250/492.2; 250/398

(58) Field of Classification Search
USPC ........................................ 250/396, 398, 492
See application file for complete search history.

(56) References Cited

U.S. PATENT DOCUMENTS

| 5,905,267 | A | * | 5/1999 | Muraki | 250/492.22 |
| 2001/0004185 | A1 | | 6/2001 | Muraki | |
| 2004/0119021 | A1 | * | 6/2004 | Parker et al. | 250/396 R |
| 2005/0104013 | A1 | | 5/2005 | Stengl | |

FOREIGN PATENT DOCUMENTS

| EP | 1432009 A2 | 6/2004 |
| EP | 1523027 A2 | 4/2005 |
| JP | 2008027965 A | 2/2008 |

OTHER PUBLICATIONS

International Search Report for PCT/EP2009/054467 (issued Sep. 25, 2009).
Dutch Search report for NL 2002031 (issued Jun. 18, 2009).

\* cited by examiner

*Primary Examiner* — Jack Berman
(74) *Attorney, Agent, or Firm* — Hoyng Monegier LLP; David P. Owen; Coraline J. Haitjema

(57) ABSTRACT

The invention relates to a charged particle multi-beamlet system for exposing a target using a plurality of beamlets. The system has a charged particle source, an aperture array, a beamlet manipulator, a beamlet blanker, and an array of projection lens systems. The charged particle source is configured to generate a charged particle beam. The aperture array is configured to define separate beamlets from the generated beam. The beamlet manipulator is configured to converge groups of the beamlets towards a common point of convergence for each group. The beamlet blanker is configured to controllably blank beamlets in the groups of beamlets. Finally, the array of projection lens systems is configured to project unblanked beamlets of the groups of beamlets on to the surface of the target. The beamlet manipulator is further adapted to converge each of the groups of beamlets towards a point corresponding to one of the projection lens systems.

14 Claims, 8 Drawing Sheets

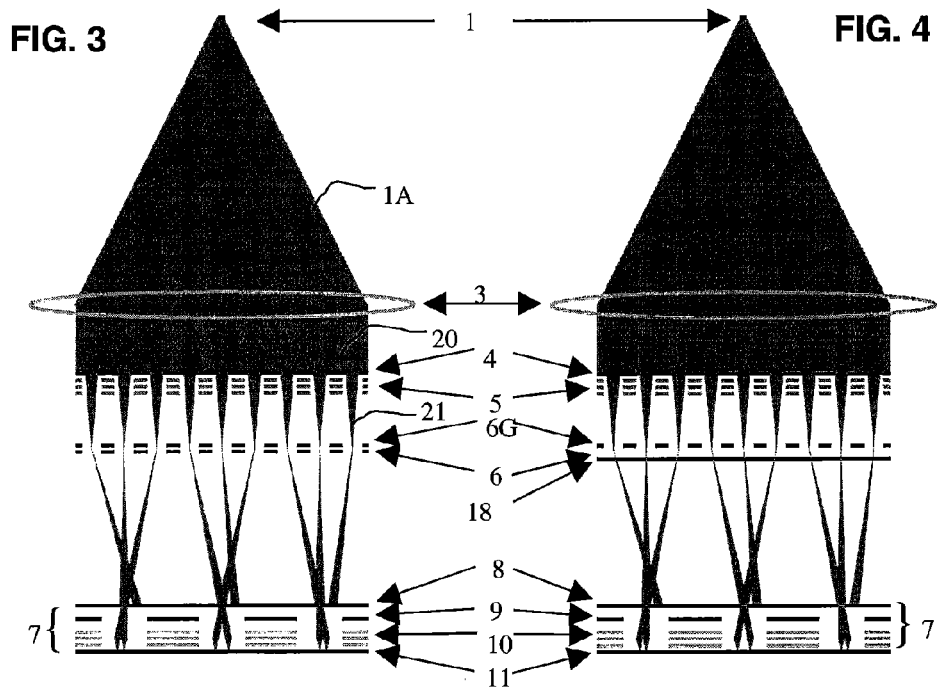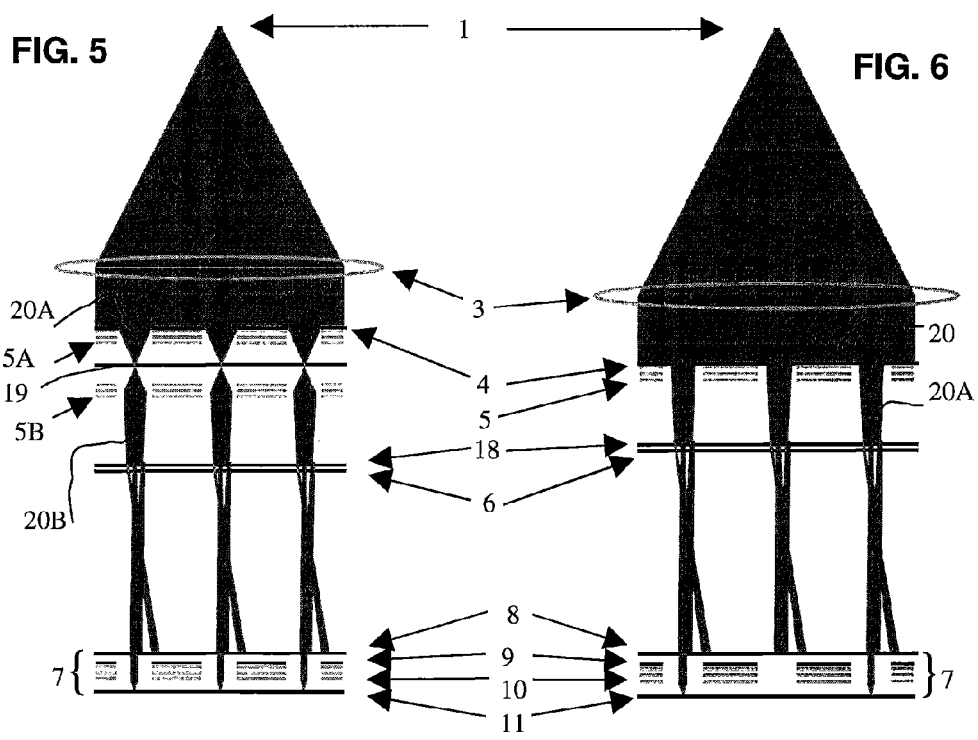

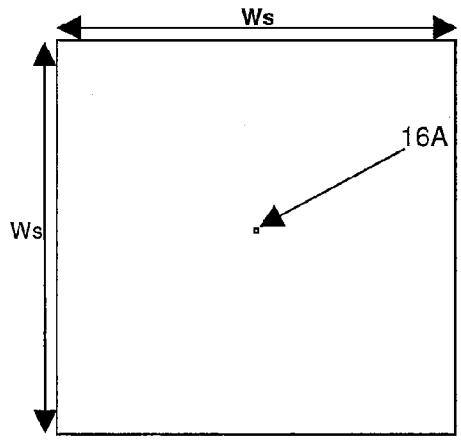
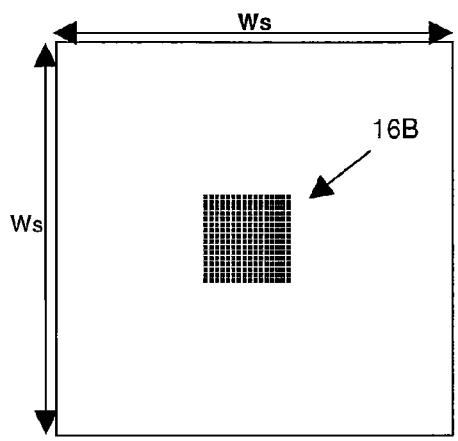
FIG. 13A                FIG. 13B
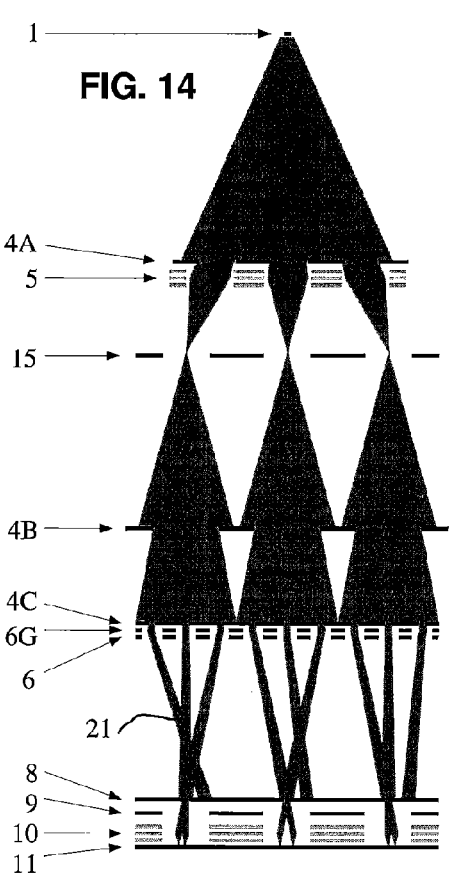
FIG. 14
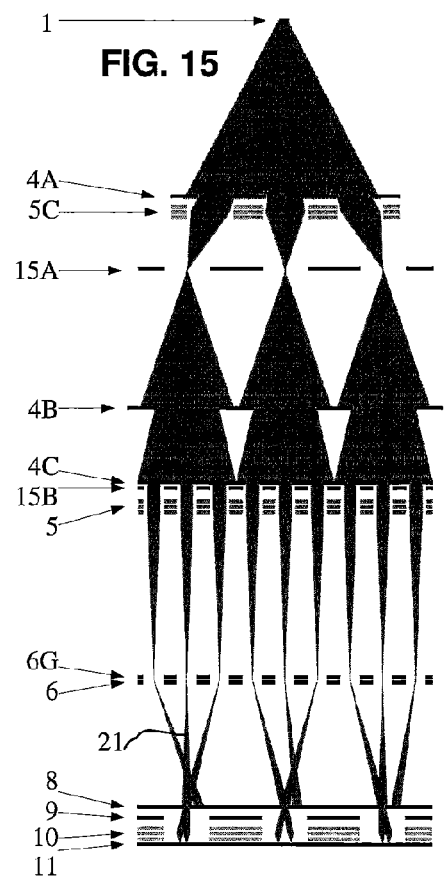
FIG. 15

PROJECTION LENS ARRANGEMENT

BACKGROUND OF THE INVENTION

1. Field of the Invention

The present invention relates to a projection system for a charged particle multi-beamlet system, such as for a charged particle multi beamlet lithography system or an inspection system, and an end module for such a projection system.

2. Description of the Related Art

Currently, most commercial lithography systems use a mask as a means to store and reproduce the pattern data for exposing a target, such as a wafer with a coating of resist. In a maskless lithography system, beamlets of charged particles are used to write the pattern data onto the target. The beamlets are individually controlled, for example by individually switching them on and off, to generate the required pattern. For high resolution lithography systems designed to operate at a commercially acceptable throughput, the size, complexity, and cost of such systems becomes an obstacle.

One type of design used for charged particle multi-beamlet systems is shown for example in U.S. Pat. No. 5,905,267, in which an electron beam is expanded, collimated and split by an aperture array into a plurality of beamlets. The obtained image is then reduced by a reduction electron optical system and projected onto a wafer. The reduction electron optical system focuses and demagnifies all the beamlets together, so that the entire set of beamlets is imaged and reduced in size. In this design, all the beamlets cross at a common cross-over, which introduces distortions and reduction of the resolution due to interactions between the charged particles in the beamlets.

Designs without such a common cross-over have also been proposed, in which the beamlets are focused and demagnified individually. However, when such a system is constructed having a large number of beamlets, providing multiple lenses for controlling each beamlet individually becomes impractical. The construction of a large number of individually controlled lenses adds complexity to the system, and the pitch between the lenses must be sufficient to permit room for the necessary components for each lens and to permit access for individual control signals to each lens. The greater height of the optical column of such a system results in several drawbacks, such as the increased volume of vacuum to be maintained and the long path for the beamlets which increases e.g. the effect of alignment errors caused by drift of the beamlets.

A charged-particle multi-beam exposure apparatus is disclosed in patent publication US2001/0004185, for exposure of a target. An illumination system is adapted to produce an electron beam and form it into a substantially telecentric beam illuminating an element electron optical system array comprising an aperture array, blanker array, and stopper array. The electrons propagate along separate paths through the element electron optical system. A projection optics system projects the resulting beamlets onto the target. The illuminating system and the projection optics system use particle-optical lenses with lens elements common to more than one electron beamlet, so-called macro optical elements.

The apparatus according to this state of the art typically comprises a sequence of two so-called symmetrical magnetic doublets, which produce two cross-overs common to the beamlets within a set of telecentric beams or beamlets. While in principle multiple columns of the type described above may be used side by side to increase capacity, the size of the lens systems involved in this type of system make this solution impractical.

The use of macro optical elements as known from these early designs for charged particle systems, does not permit the beamlets to travel straight throughout the charged particle column and makes uniform control of the beamlets more difficult. For systems using a very large number of particle beamlets, such designs are thus considered sub-optimal in view of ultra-high precision requirements for operations such as overlay and stitching. Applying elements for individual adjustment of a large number of beamlets is moreover considered overly complicated.

To meet the demand for ever smaller nodes (the next node being defined as a factor 1.4 or sqrt(2) smaller dimensions), it is required to reduce the spot size by a factor of 1.4 in charged particle systems, and to double the total current in the system. When reducing spot size by a factor of 1.4, a smaller point spread function (PSF) of charged particle beamlets is required to maintain exposure latitude. The current per beamlet drops by a factor of four due to the smaller PSF, given that the current per beam is defined by a system constant C, a source brightness, and the fourth power of the PSF. The total current on the target, in many cases a wafer, should double to limit shot noise, so that the number of electrons per square critical diameter remains the same, while the resist sensitivity should double, e.g. from 30 to 60 µm per cm2. All in all, so as to maintain throughput, the amount of additional current required to realize a next technical node in charged particle lithography, requires an eight-fold increase in the combined effect of system constant C, the number of beams in the system, and source brightness. While system constant and source brightness may be varied only to a limited extent, the number of beamlets in a system can be considerably increased. In a practical implementation processing wafers as a target, and achieving a throughput of at least e.g. ten wafers per hour, the number of beamlets required is in the order of tens of thousands to hundreds of thousands.

One system addressing such need for a vast multiplicity of beamlets (beamlets per square surface), and also addressing the difficulties encountered in dealing with aberrations as encountered in common cross-overs as in the prior art, is known from U.S. Pat. No. 6,958,804 in the name of present applicant. The lithography system defined by this patent allows the inclusion of a vast multiplicity of beamlets maintained on separate paths, i.e. without a common cross-over, by applying arrayed charged particle optical members, such as electrostatic elements, virtually throughout the charged particle system, including the projection parts. This principle difference in layout of the charged particle column of the system allows proper control of all of the beamlets in the system and does not require specific adaptations in response to differences in field strength over the cross section of macro components such as a macro deflector as required in the prior art. Moreover, the application of arrayed elements at least more easily allows application of high frequency switching, which is difficult if not impossible at macro components such as macro-deflectors. Yet even this technology is faced with limits as to number of projection lens systems per square surface, in that at ultimate miniaturization and close distribution of lens systems per square surface, practical problems are encountered in flash over of electric fields of subsequent projection lens elements in the charged particle column.

Where existing charged particle beam technology is suitable for lithography systems for relatively course patterning of images, for example to achieve critical dimensions of 90 nm and higher, a growing need exists for improved performance. It is desired to achieve considerably smaller critical dimensions, for example 22 nm, while maintaining sufficient wafer throughput, e.g. between 10 and 60 wafers per hour.

BRIEF SUMMARY OF THE INVENTION

The present invention aims to provide a multiple beamlet charged particle lithography system able to achieve smaller critical dimensions, for example 22 nm, while maintaining sufficient wafer throughput, for example between 10 and 60 wafers per hour. The insight underlying the present invention is that this higher resolution can be obtained in a multi-beamlet charged particle system by considerably reducing the spot size while at the same time considerably increasing the current generated in the system.

Not only is a reduced spot size required to achieve the desired performance, but also a reduced point spread function of beamlets is required to maintain sufficient exposure latitude. Sufficient exposure latitude requires a relatively high ratio of peak exposure level on the target from a beamlet compared to base or background level of exposure as normally caused by the peripheral Gaussian parts of neighbouring beamlets. Designing a system to generate beamlets having a smaller point spread function, however, considerably reduces the charged particle current that may be applied to the target by each beamlet.

The requirements of reduced spot size, increased current, and reduced point spread function implies a considerable increase in the number of beamlets in the system. This creates a problem due to the limited physical dimensions of the projection optics in a multi-beamlet system, which are typically limited to a size corresponding to the size of the die to be exposed. The number of projection lenses that can be constructed within such dimensions using known techniques is considerably smaller than the number of beamlets required to achieve the desired wafer throughput given the above requirements.

The present invention solves this problem by providing array manipulators in the system, which may take various forms such as a group deflector array, a condenser lens array, or aperture array, for directing a plurality of beamlets in groups towards a single projection lens. This measure permits a considerable increase in the number of beamlets in the system, without a need to design and manufacture a lens miniaturized to the extreme extent as performed in the array manipulators. The invention thus teaches to avoid even further miniaturization in an area within the projection column where due to the size, pitch, vertical proximity and level of electric field strength, the risk of electric flash and consequent destruction of the lens system in operation already pose a significant problem. In contrast, miniaturization in the area of a beamlet manipulator, due to the absence of field strengths of a magnitude as encountered at the projection lens system, does not pose such operational effects, nor problems with manufacture that can not be overcome, e.g. as a consequence to the use of more or less standard MEMS manufacturing techniques of these components. Another insight underlying the present invention is that projection of a beamlet originating from a direction of convergence is effectively the same as deflection of a vertical beamlet. This implies that the measure according to the present invention does not induce or require a principle redesign of the existing final projection lens system known from the prior art. A third insight underlying the present invention is that converging only groups of beamlets avoids the presence of a common cross-over of all the beamlets in the entire system, i.e. of all of the charged particle current therein. Thus, the adverse effects caused by aberration at the point of convergence will be of a limited controlled effect. A fourth insight underlying the invention is that the ability to blank beamlets within the group of beamlets passing through a single projection lens results in "patterned beamlets" being projected onto the target.

The present invention provides a charged particle multi-beamlet system for exposing a target using a plurality of beamlets, the system comprising at least one charged particle source for generating a charged particle beam, an aperture array defining separate beamlets or sub-beams from the generated beam, a beamlet manipulator for converging groups of beamlets towards a common point of convergence for each group, a beamlet blanker for controllably blanking beamlets in the groups of beamlets, and an array of projection lens systems for projecting beamlets on to the surface of the target, wherein the beamlet manipulator is adapted to converge each group of beamlets towards a point corresponding to one of the projection lens systems.

The beamlet manipulator may comprise a group deflector array, and the group deflector array preferably comprises a group-wise arrangement of individual deflector elements with a non-uniform deflecting action. Unblanked beamlets in each group are preferably deflected to a single point of convergence, and each group of beamlets is directed towards a different point of convergence. The group deflector array may be integrated with the beamlet blanker, the integrated group deflector/beamlet blanker being adapted to converge unblanked beamlets in each group to a common point and not converge blanked beamlets to the common point. The group deflector array may comprise a plate having apertures formed therein and electrodes associated with each aperture, the electrodes receiving electrical signals for deflecting beamlets passing through the apertures.

The system may also include a shaping aperture array for shaping the beamlets. The aperture array is adapted for defining sub-beams and the shaping aperture array is adapted for creating beamlets from the sub-beam (sub-beamlets), the aperture array and the shaping aperture array being integrated into a single unit. The group deflector array and the shaping aperture array may also be integrated in a single unit.

The beamlet manipulator may alternatively comprise a condenser lens array and a shaping aperture array. The condenser lens array is preferably adapted for focusing each sub-beam at point corresponding to a projection lens system. The shaping aperture array preferably comprises apertures for producing a plurality of beamlets from each focused sub-beam, the unblanked beamlets of the plurality of beamlets converging on a point corresponding to a projection lens system. The aperture array is preferably adapted for defining sub-beams and the shaping aperture array for creating beamlets, the aperture array and the shaping aperture array preferably being integrated into a single unit.

The beamlet manipulator may also comprise first and second condenser lens arrays and a shaping aperture array. The first condenser lens array is preferably adapted for focusing the sub-beams at a common plane before the second condenser lens array, and the second condenser lens array adapted for focusing each sub-beam at a point corresponding to one of the projection lens systems. The shaping aperture array preferably comprises apertures for producing a plurality of beamlets from each sub-beam focused by the second condenser lens array, the unblanked beamlets of the plurality of beamlets converging on point corresponding to one of the projection lens systems.

The number of beamlets generated in the system is preferably larger than the number of projection lens systems, and the system may comprise at least 10,000 projection lens systems. The number of beamlets generated in the system is preferably at least three times the number of projection lens systems, and may be from 10 to 200 times the number of projection lens systems.

According to another aspect of the invention, a charged particle multi-beamlet system for exposing a target using a plurality of beamlets is provided, the system comprising at least one charged particle source for generating a charged particle beam, a first aperture array for creating sub-beams from the generated beam, a condenser lens array for focusing the sub-beams, a second aperture array for creating a plurality of beamlets from each focused sub-beam, a beamlet blanker for controllably blanking beamlets in the groups of beamlets, and an array of projection lens systems for projecting beamlets on to the surface of the target, wherein the condenser lens array is adapted for focusing each sub-beam at a point corresponding to one of the projection lens systems.

According to yet another aspect of the invention, a charged particle multi-beamlet system for exposing a target using a plurality of beamlets is provided, the system comprising at least one charged particle source for generating a charged particle beam, a first aperture array for creating sub-beams from the generated beam, a second aperture array for creating a plurality of beamlets from each focused sub-beam, a condenser lens array for focusing the beamlets, a beamlet blanker for controllably blanking beamlets in the groups of beamlets, and an array of projection lens systems for projecting beamlets on to the surface of the target, wherein the condenser lens array is adapted for focusing the beamlets formed from each sub-beam at a point corresponding to one of the projection lens systems.

The first and second aperture arrays may be integrated into a single unit. The first aperture array preferably comprises comparatively large apertures and the second aperture array preferably comprises a group of comparatively small apertures corresponding to each large aperture in the first aperture array, the walls of the large apertures extending upwardly from a plane of the second aperture array. The walls of the large apertures preferably enclose an area accommodating the group of small apertures of the second aperture array, and the walls of the large apertures preferably extend upwards to a considerable extend in comparison to the thickness of the second aperture array. The second aperture array may also be combined with the beamlet blanker.

According to still another aspect of the invention, a charged particle multi-beamlet system for exposing a target using a plurality of beamlets is provided, the system comprising at least one charged particle source for generating a charged particle beam, an aperture array for creating separate beamlets from the generated beam, a beamlet blanker for controllably blanking beamlets, and an array of projection lens systems for projecting beamlets on to the surface of the target, wherein the beamlet blanker comprises group-wise arranged sub-arrays of deflectors.

The beamlet blanker preferably comprises a plate having a plurality of apertures formed therein, and each deflector of the beamlet blanker comprising a switching electrode associated with an aperture for deflecting a beamlet passing through the aperture. The switching electrodes of a group of deflectors are preferably connected to electric control lines arranged in a single line of orientation, and the control lines of each of two parts of a group are preferably directed in opposed directions. Each deflector is preferably provided with a memory cell for controlling a switching electrode of the deflector, and each memory cell is electrically preferably connected to two control lines, each control line being connected in common to a row or column of memory cells of a group.

The direction in which the beamlets are deflected to blank the beamlets preferably differs for different beamlets in a group of beamlets. The blanking direction is preferably chosen such that the center of mass of the blanked beamlets, at the location of a beam stop array, is substantially the same as the position of the unblanked beamlets at said location. The direction of deflection of blanked beamlets may also be changed dynamically, so that the center of mass of the blanked beamlets, at the location of a beam stop array, is substantially the same as the position of the unblanked beamlets at said location.

According to still another aspect of the invention, a charged particle multi-beamlet system for exposing a target using a plurality of beamlets is provided, the system comprising one or more plates having an array of holes formed in them for forming the beamlets, and a projection lens arrangement comprising one or more plates and one or more arrays of projection lenses, each plate having an array of apertures formed therein with the projection lenses formed at the locations of the apertures, the one or more arrays of projection lenses forming an array of projection lens systems, each projection lens system comprising one or more of the projection lenses formed at corresponding points of the one or more arrays of projection lenses, wherein the number of projection lens systems is smaller that the number of beamlets, so that each projection lens system projects a plurality of beamlets on to the target.

BRIEF DESCRIPTION OF THE DRAWINGS

Various aspects of the invention will be further explained with reference to embodiments shown in the drawings wherein:

FIG. 3 is a simplified schematic of a lithography system including a group deflection array;

FIG. 4 is a simplified schematic of the system of FIG. 3 further including a shaped aperture array;

FIG. 5 is an alternative embodiment including two condenser arrays and a shaped aperture array;

FIG. 6 is another embodiment including a single condenser array and a shaped aperture array;

FIGS. 13A and 13B illustrate an advantage of the multiple beamlet per projection lens arrangement;

FIG. 14 and FIG. 15 are further embodiments allowing the use of unmodified or relatively simple source and projection lens systems;

DESCRIPTION OF ILLUSTRATIVE EMBODIMENTS

The following is a description of various embodiments of the invention, given by way of example only and with reference to the drawings.

Figure 1:
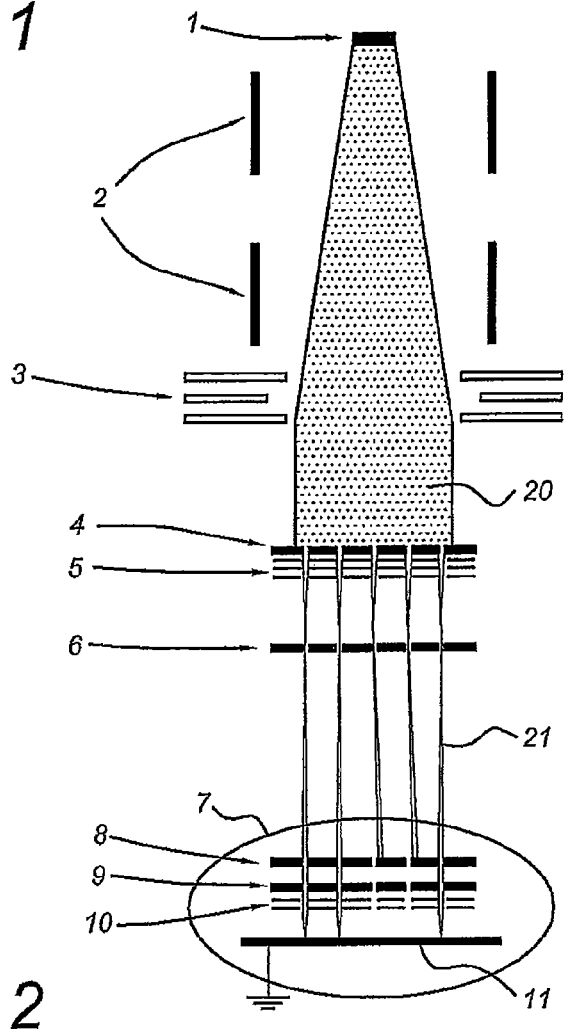
FIG. 1 is a simplified schematic overview of an example of a charged particle multi beamlet lithography system.

FIG. 1 shows a simplified schematic drawing of an embodiment of a charged particle multi-beamlet lithography system based upon an electron beam optical system without a common cross-over of all the electron beams. Such lithography systems are described for example in U.S. Pat. Nos. 6,897,458 and 6,958,804 and 7,084,414 and 7,129,502 which are all hereby incorporated by reference in their entirety, assigned to the owner of the present invention. In the embodiment shown in FIG. 1, the lithography system comprises an electron source 1 for producing a homogeneous, expanding electron beam 20. Beam energy is preferably maintained relatively low in the range of about 1 to 10 keV. To achieve this, the acceleration voltage is preferably low, the electron source preferably kept at between about −1 to −10 kV with respect to the target at ground potential, although other settings may also be used.

The electron beam 20 from the electron source 1 passes a double octopole 2 and subsequently a collimator lens 3 for collimating the electron beam 20. Subsequently, the electron beam 20 impinges on an aperture array 4, which blocks part of the beam and allows a plurality of beamlets 21 to pass through the aperture array 4. The aperture array preferably comprises a plate having through holes. Thus, a plurality of parallel electron beamlets 21 is produced. The system generates a large number of beamlets 21, preferably about 10,000 to 1,000,000 beamlets, although it is of course possible to use more or less beamlets. Note that other known methods may also be used to generate collimated beamlets.

The plurality of electron beamlets 21 pass through a condenser lens array 5 which focuses each of the electron beamlets 21 in the plane of a beamlet blanker array 6. This beamlet blanker array 6 preferably comprises a plurality of blankers which are each capable of deflecting one or more of the electron beamlets 21. The condenser lens array 5 and beamlet blanker array 6 are described in more detail below.

Subsequently, the electron beamlets 21 enter the end module 7. The end module 7 is preferably constructed as an insertable, replaceable unit which comprises various components. In this embodiment, the end module comprises a beam stop array 8, a beam deflector array 9, and a projection lens arrangement 10, although not all of these need be included in the end module and they may be arranged differently. The end module 7 will, amongst other functions, provide a demagnification of about 25 to 500 times, preferably in the range 50 to 200 times. A slightly lesser demagnification is required in systems generating patterned beamlets. The end module 7 preferably deflects the beamlets as described below. After leaving the end module 7, the beamlets 21 impinge on a surface of a target 11 positioned at a target plane. For lithography applications, the target usually comprises a wafer provided with a charged-particle sensitive layer or resist layer.

In the end module 7, the electron beamlets 21 first pass beam stop array 8. This beam stop array 8 largely determines the opening angle of the beamlets. In this embodiment, the beam stop array comprises an array of apertures for allowing beamlets to pass through. The beam stop array, in its basic form, comprises a substrate provided with through holes, typically round holes although other shapes may also be used. In one embodiment, the substrate of the beam stop array 8 is formed from a silicon wafer with a regularly spaced array of through holes, and may be coated with a surface layer of a metal to prevent surface charging. In one embodiment, the metal is of a type which does not form a native-oxide skin layer, such as CrMo.

In one embodiment, the passages of the beam stop array 8 are aligned with the elements of the beamlet blanker array 6. The beamlet blanker array 6 and beam stop array 8 operate together to block or let pass the beamlets 21. If beamlet blanker array 6 deflects a beamlet, it will not pass through the corresponding aperture in beam stop array 8, but instead will be blocked by the substrate of beam stop array 8. But if beamlet blanker array 6 does not deflect a beamlet, then it will pass through the corresponding aperture in beam stop array 8 and will then be projected as a spot on the surface of target 11. In this way the individual beamlets may be effectively switched on and off.

Next, the beamlets pass through a beam deflector array 9 which provides for deflection of each beamlet 21 in the X and/or Y direction, substantially perpendicular to the direction of the undeflected beamlets 21. Next, the beamlets 21 pass through projection lens arrangement 10 and are projected onto a target 11, typically a wafer, in a target plane.

For consistency and homogeneity of current and charge both within a projected spot and among the projected spots on the target, and as beam stop plate 8 largely determines the opening angle of a beamlet, the diameter of the apertures in beam stop array 8 are preferably smaller than the diameter of the beamlets when they reach the beam stop array. In one embodiment, the apertures in beam stop array 8 have a diameter are in a range of 5 to 20 μm, while the diameter of the beamlets 21 impinging on beam stop array 8 in the described embodiment are typically in the range of about 15 to 75 μm.

The diameter of the apertures in beam stop plate 8 in the present example limit the cross section of a beamlet, which would otherwise be of a diameter value within the range of 30 to 75 μm, to the above stated value within the range of 5 to 20 μm, and more preferably within the range of 5 to 10 μm. In this way, only a central part of a beamlet is allowed to pass through beam stop plate 8 for projection onto target 11. This central part of a beamlet has a relatively uniform charge density. Such cut-off of a circumferential section of a beamlet by the beam stop array 8 also largely determines the opening angle of a beamlet in the end module 7 of the system, as well as the amount of current at the target 11. In one embodiment, the apertures in beam stop array 8 are round, resulting in beamlets with a generally uniform opening angle.

Figure 2:
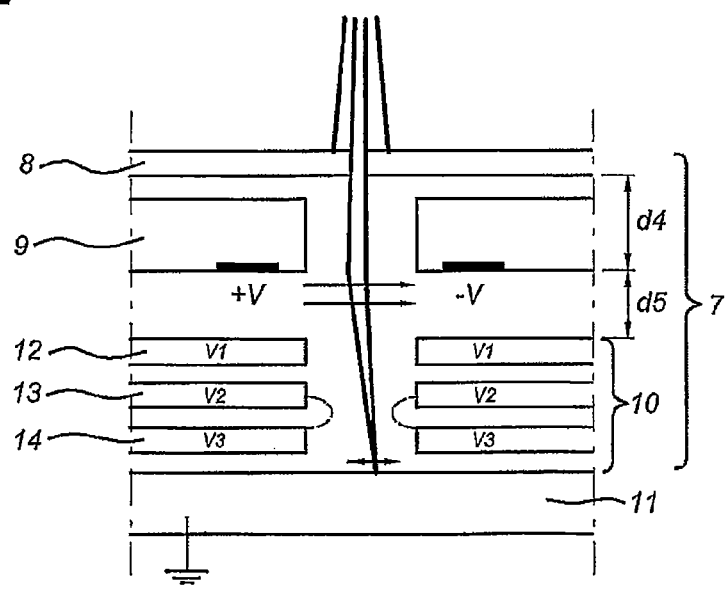
FIG. 2 is a simplified schematic overview, in side view, of an end module of the lithography system of FIG. 1.

FIG. 2 shows an embodiment of end module 7 in more detail, showing the beam stop array 8, the deflection array 9, and the projection lens arrangement 10, projecting an electron beamlet onto a target 11. The beamlets 21 are projected onto target 11, preferably resulting in a geometric spot size of about 10 to 30 nanometers in diameter, and more preferably about 20 nanometers. The projection lens arrangement 10 in such a design preferably provides a demagnification of about 100 to 500 times. In this embodiment, as shown in FIG. 2, a central part of a beamlet 21 first passes through beam stop array 8 (assuming it has not been deflected by beamlet blanker array 6). Then, the beamlet passes through a deflector or set of deflectors arranged in a sequence forming a deflection system, of beam deflector array 9. The beamlet 21 subsequently passes through an electro-optical system of projection lens arrangement 10 and finally impinges on a target 11 in the target plane.

The projection lens arrangement 10, in the embodiment shown in FIG. 2, has three plates 12, 13 and 14 arranged in sequence, used to form an array of electrostatic lenses. The plates 12, 13, and 14 preferably comprise plates or substrates with apertures formed in them. The apertures are preferably formed as round holes though the substrate, although other shapes can also be used. In one embodiment, the substrates are formed of silicon or other semiconductor processed using process steps well-known in the semiconductor chip industry. The apertures can be conveniently formed in the substrates using lithography and etching techniques known in the semiconductor manufacturing industry, for example. The lithography and etching techniques used are preferably controlled sufficiently precisely to ensure uniformity in the position, size, and shape of the apertures. This uniformity permits the elimination of the requirement to individually control the focus and path of each beamlet.

Uniformity in the positioning of the apertures, i.e. a uniform distance (pitch) between the apertures and uniform arrangement of the apertures over the surface of the substrate, permits the construction of a system with densely packed beamlets which generate a uniform grid pattern on the target. In one embodiment, where the pitch between the apertures is in the range 50 to 500 microns, the deviation in the pitch is preferably 100 nanometers or less. Furthermore, in systems where multiple plates are used, the corresponding apertures in each plate are aligned. Misalignment in the apertures between plates may cause a difference in focal length along different axes.

Uniformity in the size of the apertures enables uniformity in the electrostatic projection lenses formed at the locations of the apertures. Deviation in the size of the lenses will result in deviation in the focusing, so that some beamlets will be focused on the target plane and others will not. In one embodiment, where the size of the apertures in the range of 50 to 150 microns, the deviation in the size is preferably 100 nanometers or less.

Uniformity in the shape of the apertures is also important. Where round holes are used, uniformity in the roundness of the holes results in the focal length of the resulting lens being the same in both axes.

The substrates are preferably coated in an electrically conductive coating to form electrodes. The conductive coating preferably forms a single electrode on each substrate covering both surfaces of the plate around the apertures and inside the holes. A metal with a conductive native oxide is preferably used for the electrode, such as molybdenum, deposited onto the plate using techniques well known in the semiconductor manufacturing industry, for example. An electrical voltage is applied to each electrode to control the shape of the electrostatic lenses formed at the location of each aperture. Each electrode is controlled by a single control voltage for the complete array. Thus, in the embodiment shown with three electrodes lens there will be only three voltages for all the thousands of lenses.

FIG. 2 shows the plates 12, 13, and 14 having electric voltages V1, V2 and V3 respectively applied to their electrodes. The voltage differences between the electrodes of plates 12 and 13, and between plates 13 and 14, create electrostatic lenses at the location of each aperture in the plates. This generates a "vertical" set of electrostatic lenses at each position in the array of apertures, mutually aligned, creating an array of projection lens systems. Each projection lens system comprises the set of electrostatic lenses formed at corresponding points of the arrays of apertures of each plate. Each set of electrostatic lenses forming a projection lens system can be considered as a single effective projection lens, which focuses and demagnifies one or more beamlets, and has an effective focal length and an effective demagnification. In systems where only a single plate is used, a single voltage may be used in conjunction with a ground plane, such that electrostatic lenses are formed at the location of each aperture in the plate.

Variation in the uniformity of the apertures will result in variation in the electrostatic lenses forming at the locations of the apertures. The uniformity of the apertures results in uniform electrostatic lenses. Thus, the three control voltages V1, V2, and V3 create an array of uniform electrostatic lenses which focus and demagnify the large number of electron beamlets 21. The characteristics of the electrostatic lenses are controlled by the three control voltages, so that the amount of focusing and demagnification of all of the beamlets can be controlled by controlling these three voltages. In this way, a single common control signal can be used to control a whole array of electrostatic lenses for demagnifying and focusing a very large number of electron beamlets. A common control signal may be provided for each plate or as a voltage difference between two or more plates. The number of plates used in different projection lens arrangements may vary, and the number of common control signals may also vary. Where the apertures have sufficiently uniform placement and dimensions, this enables the focusing of the electron beamlets, and demagnification of the beamlets, using one or more common control signals. In the embodiment of FIG. 2, three common signals comprising the three control voltages V1, V2, and V3 are thus used to focus and demagnify all of the beamlets 21.

The projection lens arrangement preferably forms all of the focusing means for focusing the beamlets onto the target surface. This is made possible by the uniformity of the projection lenses, which provide sufficiently uniform focusing and demagnification of the beamlets so that no correction of the focus and/or path of individual electron beamlets is required. This considerably reduces the cost and complexity of the overall system, by simplifying construction of the system, simplifying control and adjustment of the system, and greatly reducing the size of the system.

In one embodiment, the placement and dimensions of the apertures where the projection lenses are formed are controlled within a tolerance sufficient to enable focusing of the electron beamlets using one or more common control signals to achieve a focal length uniformity better than 0.05%. The projection lens systems are spaced apart at a nominal pitch, and each electron beamlet is focused to form a spot on the surface of the target. The placement and dimensions of the apertures in the plates are preferably controlled within a tolerance sufficient to achieve a variation in spatial distribution of the spots on the surface of the target of less than 0.2% of the nominal pitch.

The projection lens arrangement 10 is compact with the plates 12, 13, 14 being located close to each other, so that despite the relatively low voltages used on the electrodes (in comparison to voltages typically used in electron beam optics), it can produce very high electrical fields. These high electrical fields generate electrostatic projection lenses which have a small focal distance, since for electrostatic lenses the focal length can be estimated as proportional to beam energy divided by electrostatic field strength between the electrodes. In this respect, where previously 10 kV/mm could be realized, the present embodiment preferably applies potential differences within the range of 25 to 50 kV/mm between the second plate 13 and third plate 14. These voltages V1, V2, and V3 are preferably set so that the difference in voltage between the second and third plates (13 and 14) is greater than the difference in voltage between first and second plates (12 and 13).

This results in stronger lenses being formed between plates 13 and 14 so that the effective lens plane of each projection lens system is located between plates 13 and 14, as indicated in FIG. 2 by the curved dashed lines between plates 13 and 14 in the lens opening. This places the effective lens plane closer to the target and enables the projection lens systems to have a shorter focal length. It is further noted that while, for simplicity, the beamlet in FIG. 2 is shown focused as from the deflector 9, a more accurate representation of the focusing of beamlet 21, e.g. as in a traced ray illustration, would indicate that the actual lens plane of lens system 10 is between plates 13 and 14. It should also be noted that the distance d3 between lowermost plate 14 and target plane 11 should be very small in this design to allow for the short focal length.

The electrode voltages V1, V2, and V3 are preferably set so that voltage V2 is closer to the voltage of the electron source 1 than is voltage V1, causing a deceleration of the charged particles in beamlet 21. In one embodiment, the target is at 0V (ground potential) and the electron source is at about −5 kV relative to the target, voltage V1 is about −4 kV, and voltage V2 is about −4.3 kV. Voltage V3 is at about 0V relative to the target, which avoids a strong electric field between plate 14 and the target which can cause disturbances in the beamlets if the topology of the target is not flat. The distances between the plates (and other components of the projection system) are preferably small. With this arrangement, a focusing and demagnifying projection lens is realized, as well as a reduction in the speed of extracted charged particles in the beamlets. With the electron source at a voltage of about −5 kV, charged particles are decelerated by the central electrode (plate 13), and subsequently accelerated by the bottom electrode (plate 14) having a voltage at ground potential. This deceleration permits the use of lower electrical fields on the electrodes while still achieving the desired demagnification and focusing for the projection lens arrangement. An advantage of having three electrodes with control voltages V1, V2 and V3, rather than only two electrodes with control voltages V1 and V2 as used in previous systems is that control of the focusing of the beamlets is decoupled to some extent from control of the beamlet acceleration voltage. This decoupling occurs because the projection lens systems can be adjusted by adjusting the voltage differential between voltages V2 and V3 without changing voltage V1. Thus the voltage differential between voltage V1 and the source voltage is largely unchanged so that the acceleration voltage remains essentially constant, reducing the alignment consequences in the upper part of the column.

FIG. 2 also illustrates deflection of a beamlet 21 by deflection array 9 in the Y-direction, illustrated in FIG. 2 as a deflection of the beamlet from left to right. In the embodiment of FIG. 2, an aperture in deflection array 9 is shown for one or more beamlets to pass through, and electrodes are provided on opposite sides of the aperture, the electrodes provided with a voltage +V and −V. Providing a potential difference over the electrodes causes a deflection of the beamlet or beamlets passing though the aperture. Dynamically changing the voltages (or the sign of the voltages) will allow the beamlet(s) to be swept in a scanning fashion, here in the Y-direction.

In the same way as described for deflection in the Y-direction, deflection in the X-direction may also be performed back and/or forth (in FIG. 2 the X-direction is in a direction into and out of the paper). In the embodiment described, one deflection direction may be used for scanning the beamlets over the surface of a substrate while the substrate is translated in another direction using a scanning module or scanning stage. The direction of translation is preferably transverse to the Y-direction and coinciding with the X-direction.

The arrangement of the deflectors and lenses of the end module 7 with respect to one another as described differs from what has generally been expected in the art of particle optics. Typically, a deflector is located after a projection lens, so that the focusing is accomplished first and then the focused beamlet is deflected. First deflecting a beamlet and then focusing it, as in the system in FIGS. 2 and 3, results in the beamlet entering the projection lens off axis and at an angle with respect to the optical axis of the projection lens. It is evident to the person skilled in the art that the latter arrangement may give rise to considerable off-axis aberrations in the deflected beamlet.

In the application of the projection system for lithography, a beamlet should be focused and positioned at ultra high precision, with spot sizes of tens of nanometers, with an accuracy in size of nanometers, and a position accuracy in the order of nanometers. The inventors realized that deflecting a focused beamlet, for example several hundreds of nanometers away from the optical axis of a beamlet, would easily result in an out-of-focus beamlet. In order to meet the accuracy requirements, this would severely limit the amount of deflection or the beamlet would rapidly become out of focus at the surface of target 11.

As discussed above, in order to achieve the objectives of the projection lens arrangement in view of its use in a lithography system, the effective focal length of the projection lens systems is short, and the lens plane of the projection lens systems is positioned very close to the target plane. Thus, there is very little space left between the projection lens and the target plane for a beamlet deflection system. The inventors recognized that the focal length should be of such limited magnitude that any deflector or deflector system should be located before the projection lens despite the evident occurrence of off-axis aberrations with such an arrangement.

The arrangement shown in FIGS. 1 and 2 of the deflection array 9 upstream and projection lens arrangement 10 downstream furthermore allows a strong focusing of beamlet 21, in particular to permit a reduction in size (demagnification) of the beamlets of at least about 100 times, and preferably about 350 times, in systems where each projection lens system focuses only one beamlet (or a small number of beamlets). In systems where each projection lens system focuses a group of beamlets, preferably from 10 to 100 beamlets, each projection lens system provides demagnification of at least about 25 times, and preferably about 50 times. This high demagnification has another advantage in that requirements as to the precision of the apertures and lenses before (upstream of) the projection lens arrangement 10 are much reduced, thereby enabling construction of the lithography apparatus, at a reduced cost. Another advantage of this arrangement is that the column length (height) of the overall system can be greatly reduced. In this respect, it is also preferred to have the focal length of the projection lens small and the demagnification factor large, so as to arrive to a projection column of limited height, preferably less than one meter from target to electron source, and more preferably between about 150 and 700 mm in height. This design with a short column makes the lithography system easier to mount and house, and it also reduces the effect of drift of the separate beamlets due to the limited column height and shorter beamlet path. The smaller drift reduces beamlet alignment problems and enables a simpler and less costly design to be used. This arrangement, however, puts additional demands on the various components of the end module.

With a deflection system located upstream of a projection system, the deflected beamlets will no longer pass through the projection system at its optical axis. Thus, an undeflected beamlet which was focused on the target plane will now be out-of-focus at the target plane when deflected. In order to limit the out-of-focus effect due to deflection of the beamlets, in the end module of one embodiment the deflection array 9 is positioned as close as possible to the projection lens array 10. In this way, deflected beamlets will still be relatively close to their undeflected optical axis when they pass through the projection lens array. Preferably the deflection array is positioned at about 0 to 5 mm from the projection lens array 10, or preferably as close as possible while maintaining isolation from the projection lens. In a practical design, to accommodate wiring, a distance of 0.5 mm may be used.

With an arrangement as described above, the main lens plane of the projection lens system 10 is preferably located between the two plates 13 and 14. The overall energy of the charged particles in the system according to the embodiments described above is kept relatively low, as mentioned previously. For an electron beam, for example, the energy is preferably in the range of up to about 10 keV. In this way, generation of heat at the target is reduced. However, with such low energy of the charged particles, chromatic aberration in the system increases. This requires specific measures to counteract this detrimental effect. One of these is the already mentioned relatively high electrostatic field in the projection lens arrangement 10. A high electrostatic field results in forming electrostatic lenses having a low focal length, so that the lenses have low chromatic aberration.

Chromatic aberration is generally proportional to the focal length. In order to reduce chromatic aberration and provide a proper projection of electron beams onto the target plane, the focal length of the optical system is preferably limited to one millimeter or less. Furthermore, the final plate 14 of the lens system 10 according to the present invention is made very thin to enable a small focal length without the focal plane being inside the lens. The thickness of plate 14 is preferably within the range of about 50 to 200 µm.

It is desired to keep the acceleration voltage relatively low for reasons mentioned above, to obtain a relatively strong demagnification, and to maintain the aberration as low as possible. In order to meet these contradictory requirements, an arrangement is conceived having the lenses of the projection lens system positioned closely together. This new concept requires the lower electrode 14 of the projection lens preferably being provided as close as possible to the target plane, with the effect that the deflector is preferably located before the projection lens. Another measure to mitigate the aberrations caused by the arrangement of the end module 7 is to locate the deflector 9 and the projection lens arrangement 10 at minimal mutual distance.

The mutual distances in a lens array, as indicated above, are of a highly miniaturized nature. In this respect the mutual distances between plates 12, 13 and 14 are in the same order of magnitude as the thickness of the plate 13. In a preferred embodiment these mutual distances are in a range of about 100 to 200 µm. The distance from the final plate 14 to the target plane is preferably smaller than distance between the plates to allow for a short focal length. However, a minimal distance is required between the lower surface of plate 14 and surface of the wafer to provide allowance for mechanical movement of wafer. In the presently exemplified embodiment the distance from the final plate 14 to the target plane is about 50 to 100 µm. In one embodiment, the distance between plates 13 and 14 is about 200 µm, and the distance between plate 14 and the target plane is about 50 µm. These distances are related to the voltages V1, V2, and V3, and the size of the apertures 18 of the lenses of plates 12, 13 and 14 for allowing deflected beamlets to pass while focusing one or more beamlets.

In the design of an end module 7 as illustrated, the diameter of the apertures of the lenses of the plates 12, 13 and 14, is a number of times larger than the diameter of the coaxially aligned apertures of beam stop array 8, which preferably have a diameter of about 5 to 20 µm. The diameter of the apertures is preferably in range of about 50 to 150 µm. In one embodiment, the diameter is about 100 µm and the diameter of the apertures of the beam stop array is about 15 µm.

Furthermore, in the present design, the central substrate of plate 13 has the largest thickness, preferably in the range of about 50 to 500 µm. The thickness of the substrate for plate 12 is relatively smaller, preferably about 50 to 300 µm, and for plate 14 relatively smallest, preferably about 50 to 200 µm. In one embodiment, the thickness of the substrate for plate 13 is about 200 µm, for 12 is about 150 µm, and for 14 is about 150 µm.

The total current of the beamlets required to achieve a particular throughput (i.e. a particular number of wafers exposed per hour) depends on the required dose, the area of the wafer, and the overhead time (e.g. the time to move a new wafer into position for exposure). The required dose in these shot noise limited systems depends on the required feature size and uniformity, and beam energy, among other factors.

To obtain a certain feature size (critical dimension or CD) in resist using electron beam lithography, a certain resolution is required. This resolution is determined by three contributions: beam size, the scattering of electrons in the resist, and secondary electrons mean free path combined with acid diffusion. These three contributions add up in a quadratic relation to determine the total spot size. Of these three contributions the beam size and the scattering depend on the acceleration voltage. To resolve a feature in the resist the total spot size should be of the same order of magnitude as the desired feature size (CD). Not only the CD but also the CD uniformity is important for practical applications, and this latter requirement will determine the actual required spot size.

For electron beam systems, the maximum single beam current is determined by the spot size. For small spot size the current is also very small. To obtain a good CD uniformity, the required spot size will limit the single beam current to much less than the current required to obtain a high throughput. Thus a large number of beamlets is required (typically more than 10,000 for a throughput of 10 wafers per hour). For an electron beam system, the total current through one lens is limited by Coulomb interactions between electrons, so that a limited number of beamlets can be sent through one lens and/or one cross-over point. This consequently means that the number of lenses in a high throughput system also needs to be large.

In a preferred embodiment, a very dense arrangement of a large number of low energy beamlets is achieved, such that the multiple beamlets can be packed into an area comparable in size to the size of a typical wafer exposure field.

The pitch of the apertures in the plates 12, 13 and 14 of the projection lens is preferably as small as possible to create as many electrostatic lenses as possible in a small area. This enables a high density of beamlets. The large number of beamlets spaced closely together in a high density arrangement also reduces the distance the beamlets must be scanned across the target surface. However, reduction in the pitch for a given bore size of the apertures is limited by manufacturing and structural problems caused when the plate becomes too fragile due to the small distances between the apertures, and by possible aberrations in a lens caused by fringe fields of neighboring lenses.

The multi-beamlet charged particle system is designed to considerably reduce the spot size while at the same time considerably increasing the current generated in the system. In doing so, it was also realized that by increasing the current in the system, the total current on the target is also increased to limit development of shot noise. At the same time, however, the number of electrons impinging on the target surface per square critical dimension (i.e. per unit of area of CD squared) should be maintained constant. These requirements necessitate modification to the design of the charged particle system, as discussed in detail below, and for optimum performance a target with relatively high sensitivity resist is required, by way of example typically from 30 $\mu m/cm^2$ as currently practiced to double that value. It is remarked at this point that spot size in practice corresponds to, and is, as an easier to conceive term, in the remainder of the text used in stead of "point spread function". Another practical aspect of the concept according to the invention is that the spot size amounts in order of magnitude to the CD size.

Not only is a reduced spot size required to achieve the desired performance, but also a reduced point spread function of beamlets is required to maintain sufficient exposure latitude. Sufficient exposure latitude requires a relatively high ratio of peak exposure level on the target from a beamlet compared to base or background level of exposure as normally caused by the peripheral Gaussian parts of neighbouring beamlets. Designing a system to generate beamlets having a smaller point spread function, however, considerably reduces the charged particle current that may be applied to the target by each beamlet. Irrespective of the brightness of the charged particle source used, the preceding requirements of reduced spot size, increased current, and reduced point spread function implies a considerably more than linear increase in the number of beamlets in the system compared to the reduction in critical dimension at the same wafer throughput.

The requirement for a considerable increase in the number of beamlets in the system creates a practical problem due to the of the limited physical dimensions of the projection optics of a multi-beamlet lithography system. The projection optics in such systems are typically limited in size to accommodate, for example the fields of the target to be exposed by the system. There is a limit to the number of lenses that may be physically realized within a relatively small area that the projection optics, i.e. the end projection module may occupy in practical designs. At the reduced critical dimensions to be achieved, the number of lenses that can be constructed within these dimensions using known techniques is considerably smaller than the number of beamlets required to achieve the desired wafer throughput.

One solution is to reduce the image of the aperture array 4 using a condenser lens or series of condenser lenses, thereby also reducing the pitch of the beamlets. However, this solution typically results in a common cross-over of all the beamlets, which causes a significant amount aberration. This is not desirable, particularly in view of the present requirements, and would further complicate the system to counteract this aberration. The present invention avoids a common cross-over of the beamlets and thus avoids this drawback by dividing the required reduction of the image of the aperture array 4 over a multitude of cross-overs, thus limiting the energy in each cross-over. This has the effect of more than proportionally limiting the amount of aberration in the system. This is achieved by adding array manipulators to the system, for example a group deflector array or a condenser lens array for directing a plurality of beamlets towards a single projection lens system for projecting onto the target.

The principal solution introduced in the preceding paragraph, will be illustrated along various examples in the following. It allows the use of technology corresponding to that applied in the concept of FIG. 1 and minimizes aberration in the system while allowing a disproportionate increase in the number of beamlets in the system. This principal solution using multiple beamlets per projection lens was found after recognition of the fact that with the deflecting action of deflector array 9 in the end module 7, a virtual point of origin of the deflected beamlet is created, so that a virtual beamlet was imagined. This notion led to the idea that such virtual beamlet could as well be replaced by a real beamlet, or a plurality of real beamlets. In practice the application of multiple real beamlets through a single projection lens system appeared to be possible without disturbing the amount of aberration, especially where the total beamlets of the system were distributed over a multiplicity of projection lens systems.

Because part or all of the plurality of beamlets directed through to a each projection lens system may be blanked at any point in time during operation, the system according to the present invention is also referred to as a patterned beamlet system. This patterned beamlet system may also be regarded as a multiplicity of miniaturized imaging systems arranged side by side.

FIG. 3 illustrates one embodiment of a design according to the invention, for enabling an increased number of beamlets in the system, permitting increased current at the wafer or reduced spot size or both. In this embodiment, a group deflector array 6G is provided above beamlet blanker array 6 in the system of FIG. 1, between the condenser lens array 5 and beamlet blanker array 6, although the group deflector array 6G may also be located below array 6. The group deflector array 6G comprises an array of deflection elements which deflect the beamlets in groups towards the end module (projection module) 7, through openings in the beam stop array 8 and through the corresponding projection lens systems formed under each opening.

The group deflector array 6G preferably comprises one or more plates with an array of apertures formed in them at locations corresponding to the apertures in aperture array 4, condenser lens array 5, and beamlet blanker array 6. Electrodes are formed at the location of each aperture, as shown in more detail in FIGS. 18 and 19. Each element of the group deflector 6G operates to deflect one or more beamlets 21 towards a particular projection lens in the array projection lens systems of the end module 7. FIG. 3 shows three groups of three beamlets deflected by deflector array 6G, so that three beamlets are directed through each projection lens system in the end module 7. In this embodiment there are thus three times as many apertures in aperture array 4, condenser lens array 5, group deflector array 6G, and beamlet blanker array 6, than there are projection lens systems formed in the end module 7.

Although three beamlets per projection lens system is shown in FIG. 3, other numbers of beamlets per projection lens system may also be used, and groups of up to 100 beamlets or more can be directed through each projection lens system. In a preferred embodiment, groups of 49 beamlets in an array of 7 by 7 are deflected through each projection lens system.

Although FIG. 3 shows the arrays 4, 5, 6G, and 6 being approximately the same size as the end module 7, they may be may larger, particularly for designs having a large number of beamlets per projection lens system which necessitates a much larger number of apertures in the arrays 4, 5, 6G, and 6 compared with the end module 7.

Preferably the apertures in the beam stop array 8, which define the beamlet opening angle, are relatively small as if they were limiting only a single beamlet. Larger apertures would require a larger deflection path, would be more susceptible to "tail" effects caused by only partial blanking of a blanked beamlet, and would further reduce the limited space available on beam stop array 8 for blanking beamlets.

In principle each group of beamlets can be concentrated (i.e. directed to a single point where they intersect and crossover) either at the relevant aperture of beam stop array 8, or at the effective lens plane of the relevant projection lens system. In practice the concentration will be somewhere between these two points (although not clearly shown in drawings), since concentrating the beamlets at the beam stop array would create a lens error while concentrating the beamlets at the effective lens plane of the projection lens would cause a dose error.

In this design, with multiple beamlets passing through each projection lens system, the charged particle optics slit does not consist of a regular array of beamlets but of a regular array of groups of beamlets. Note that the beamlets may also be deflected by beamlet blanker array 6 after passing though group deflector array 6G. At any instant some of the beams in a group may be directed through a corresponding opening in beam stop array 8 and projected onto the target, while other beamlets are deflected an additional amount by beamlet blanker array 6. This additional deflection causes these beamlets to miss the opening in beam stop array 8 so they are blocked from reaching the target, and are thereby blanked or "switched off" as described previously. Thus, each group of beamlets exposes a pattern determined by the beam blanker array 6, and each group can be considered as a single patterned beamlet.

Figure 11A:
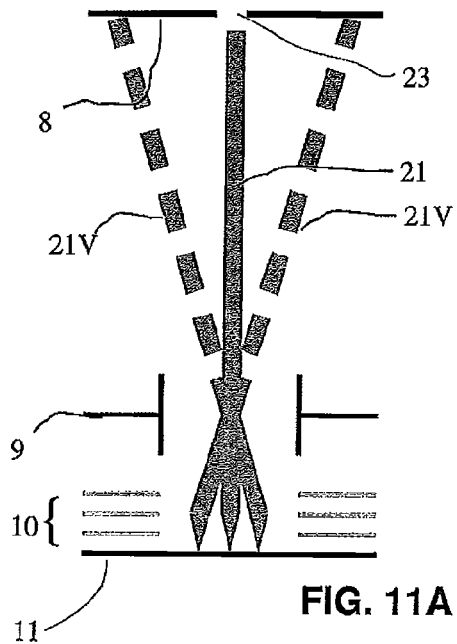
FIG. 11A and FIG. 11B are conceptual diagrams illustrating the concept of multiple beamlets per projection lens.
Figure 11B:
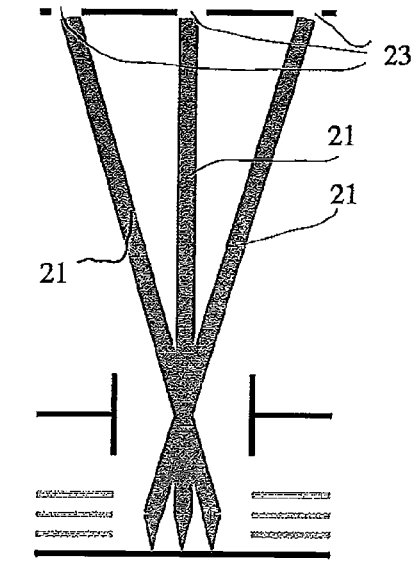

FIGS. 11A and 11B are schematic diagrams of the path of beamlets in the end module 7, to illustrate a concept and insight underlying the grouping of beamlets. FIG. 11A shows a system having a single beamlet per projection lens system. A single beamlet 21 passes through an aperture in the beam stop array 8, is deflected by deflector array 9, and focused by a projection lens arrangement 10. The deflected beamlet can be considered as a separate 'virtual' beamlet arriving at an inclined angle from a different origin than the actual beamlet 21. For example, when beamlet 21 is deflected to the left, it can be regarded as a virtual beamlet 21V originating from a location to the right of the actual origin of beamlet 21, and similarly when beamlet 21 is deflected to the right, it can be regarded as a virtual beamlet 21V originating from a location to the left of the actual origin of beamlet 21. FIG. 11B shows a system having three beamlets per projection lens system, each beamlet originating from a separate point and passing though a projection lens system at different angles. The net effect is the same as a single deflected beamlet, except that the current is three times greater in the system of FIG. 11B. Aperture plate 8 above the deflector array 9 may comprise a multiplicity of apertures 23 as depicted, or with a single relatively large aperture, or a patterned opening having a particular shape, to accommodate the multiple beamlets.

FIG. 13 is a schematic diagram to illustrate an advantage of the described arrangement with multiple beamlets per projection lens system. FIG. 13A shows a square deflection field of magnitude Wd, which in practice typically may be around 2 µm, and with a typical Gaussian beamlet spot 16A with geometric spot size diameter of 10 nm. Using this beamlet spot to expose the deflection field, approximately only 20 parts per million of the deflection field is exposed at any instant.

FIG. 13B shows the deflection field with the presently proposed design, the deflection field exposed by a patterned beamlet 16B. Up to about 20% of the deflection field may theoretically be exposed simultaneously by the patterned beamlet. In practice up to 200 times improvement may be attained as depicted schematically by FIG. 13B. In this example an array of 16 by 16 relatively small spots is shown (the representation of the array appears disproportionately large in the drawing for clarity). The multiplication of the number of beamlets that may be written simultaneously by one projection lens, together with improved beamlet intensity, results in maintained of even increased throughput of the system at considerably advanced technology nodes, e.g. expressed by measure of critical dimension in projection.

Figure 18A:
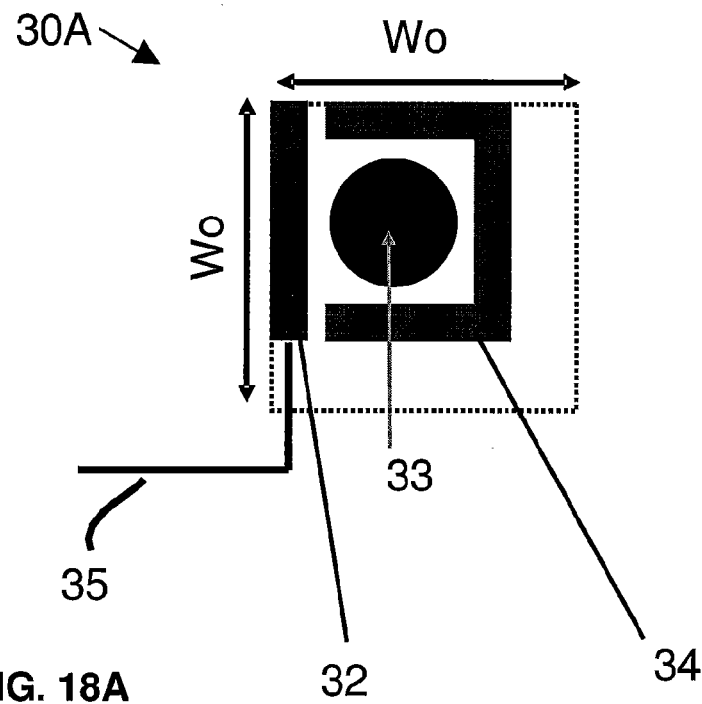
FIGS. 18A and 18B are schematic diagrams of an embodiment of deflectors for a group deflector array or beam blanker array.
Figure 18B:
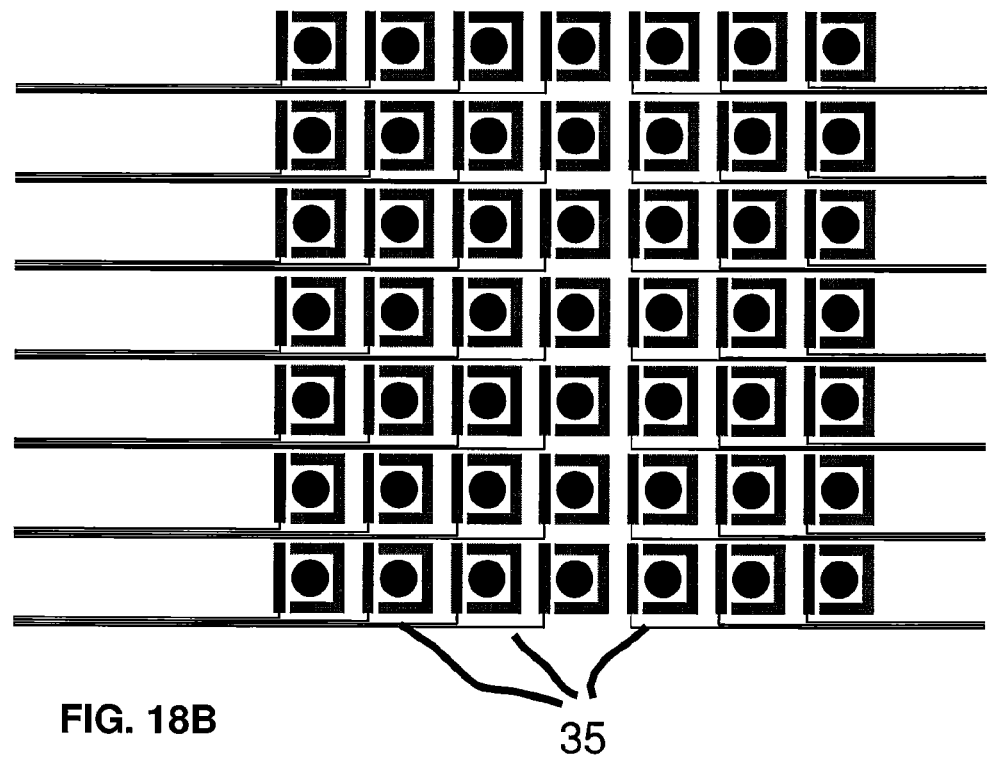

FIGS. 18A and 18B are schematic diagrams of one embodiment of deflectors for the group deflector array 6G and/or beam blanker array 6 of FIG. 3. An array of apertures are formed, preferably as round holes, though a plate. In one embodiment, the plate is formed of silicon or other semiconductor material, processed using process steps well-known in the semiconductor industry. The apertures can be formed using lithography and etching techniques known in the semiconductor industry, for example. Similarly to the plates of the projection lens arrangement 10, the lithography and etching techniques used are preferably controlled sufficiently precisely to ensure uniformity in the position, size, and shape of the apertures. FIG. 18A shows a single deflector 30A comprising one element of a beam blanker array 6 or group deflector array 6G.

The deflector 3A is formed within a budgeted square area of dimension Wo by Wo. The deflector element comprises a switching electrode 32 and a ground electrode 34, arranged around a through hole 33, through which a beamlet to be deflected may pass. The electrodes are shown as simple rectangular shapes in this embodiment, with switching electrode 32 being a straight element and ground electrode 34 formed in a U-shape. However, rounded or at least concave shapes conforming to the shape of the through hole 33 are preferred. Such a round-edged design allows a more compact design, and facilitates the arrangement of deflector elements in an array, and also facilitates the inclusion of switching electronics which may be used in some embodiments.

The switching electrode 32 receives an electrical signal which generates a electromagnetic field sufficient to deflect a beamlet passing through the aperture 33 so that the beamlet passes through a corresponding aperture in beam stop array 8, and then through the corresponding projection lens system (unless the beam blanker array 6 also deflects the beamlet so that it misses the aperture in beam stop array 8 and is blanked).

In another embodiment, the two electrodes may be designed as two identical mirror-image electrodes, and used with switching electronics to enable either one of the two electrodes to be set as the switching electrode while the other operates as the ground electrode. This is of particular advantage in embodiments with a combined group deflector and beam blanker array, where in some cases it may be beneficial to deflect "backwards" rather than "further forwards." The two types of deflectors may be mixed, for example with a central group in the group deflector/beam blanker array deflecting "further forwards" for beamlet blanking, and a peripheral group deflecting "rearwards" for blanking.

FIG. 18B shows a schematic diagram of a portion of an array of the deflector elements 30A. Individual electrical connections are formed to each switching electrode 32 of each deflector element. These wiring connections can be made, for example, by forming electrical control lines 35 as conductive structures on the surface of the plate of the group deflector array using conventional lithography and etching techniques. In the example shown, a group of 7 by 7 deflectors will require 49 electrical control lines 35. The control lines preferably run towards opposed sides of a deflector group as shown.

Figure 19A:
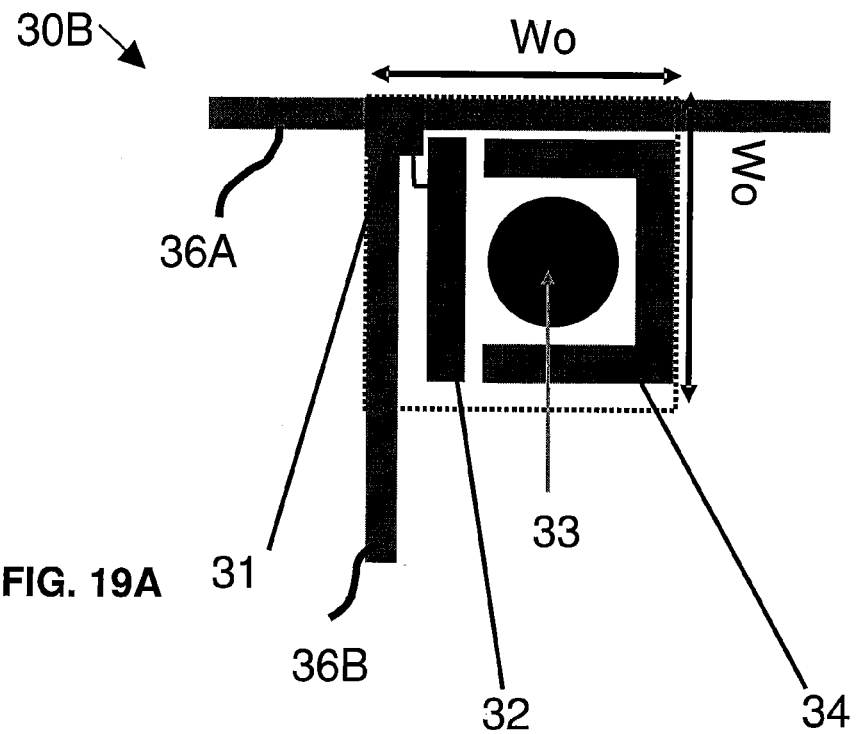
FIGS. 19A and 19B are schematic diagrams of an alternative embodiment of deflectors for a group deflector array or beam blanker array.
Figure 19B:
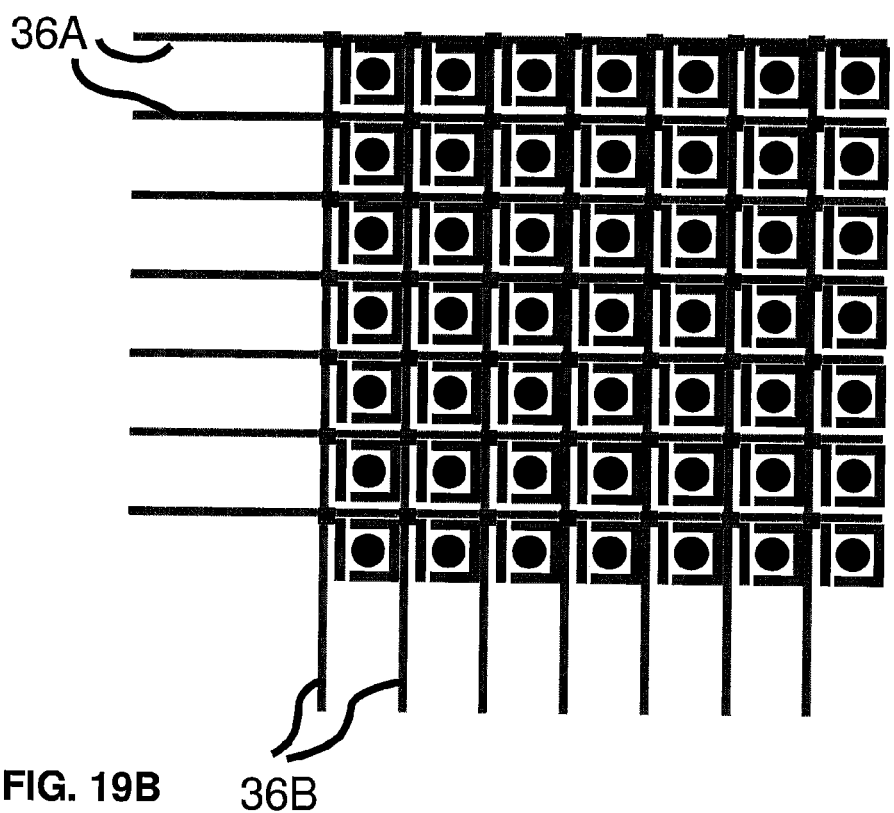

FIGS. 19A and 19B are schematic diagrams of an alternative embodiment of the group deflector array 6G and/or beam blanker array 6 of FIG. 3. FIG. 19A shows a single deflector 30B comprising one element of a beam blanker array 6 or group deflector array 6G. In this embodiment, the available space within the confinement of dimensions Wo by Wo is utilized to form a control line 36A and a transversely oriented control line 36B. A memory cell 31 is preferably formed at the intersection of these control lines. The memory cell can use a variety of known structures, and may be formed using techniques well known in the semiconductor industry. The memory cell is connected to switching electrode 32, so that an electrical signal stored in the memory cell will be applied to the switching electrode for as long as it remains in the memory cell.

FIG. 19B shows a portion of an array of the deflector elements 30B. The control lines are extended as vertical and horizontal conducting bus lines, preferably formed on the surface of the plate of the grouped deflector 6G using conventional lithography and etching techniques. In the example shown, a group of 7 by 7 deflectors will require a grid of 7 by 7 control lines, totaling 14 control lines. The control lines 36 preferably run in transverse directions towards relevant sides of the deflector group. Each memory cell in the array can be addressed by applying electrical signals to the bus lines for the corresponding row and column, using a bit-line and word-line addressing method as used in DRAM or other semiconductor memory technologies. The signal thus stored in each memory cell will control deflection of the beamlet passing through the aperture 33 corresponding to the memory cell.

The group deflector array 6G employs a group-wise arrangement of individual deflector elements with a non-uniform deflecting action. The beamlets are not deflected uniformly in a single direction, as by the sweeping or scanning deflector array 9 or beamlet blanker array 6. The beamlets within each group are deflected to a single point of convergence, and each group is directed towards a different point of convergence.

In alternative embodiment, the group deflector array 6G and beam blanker array 6 may be combined into one integrated unit. In this embodiment, the combined group deflector/blanker operates to deflect the unblanked beamlets in each group to a particular opening in beam stop array 8, while deflecting the beamlets to be blanked in each group somewhat more strongly (or weakly or in a altered direction) so that they strike the beam stop array 8, preferably near the relevant opening for the group of beamlets. The group deflector/blanker could be set so that it would blank beamlets if no signal is applied and concentrate beamlets towards the end module when a signal is applied. However, this would require maintaining a certain voltage potential on the signal lines of the combined group deflector/blanker to maintain continued deflection for a group of beamlets. Thus it is preferred to have the group deflector array 6G and beam blanker array 6 constructed as separately controlled arrays, but preferably arranged in close proximity to each other. This permits an arrangement where an easily maintained ground voltage is applied on control lines to the beam blanker in order to let beamlets through (i.e. a "normally off" beam blanker array), and the group deflector that is maintained at a particular single voltage to maintain deflection of the groups of beamlets through the projection lens systems.

FIG. 4 illustrates an alternative to the embodiment of FIG. 3, including the group deflector array 6G and additionally including a shaping aperture array 18. The shaping aperture array 18 preferably comprises one or more plates or substrates having shaped apertures formed in them at locations corresponding to the apertures in arrays 4, 5, 6G and 6. The shaping aperture array 18, similarly to the other arrays, is preferably made of silicon or other semiconductor material and the apertures are preferably formed using lithography and etching techniques, and these techniques are preferably controlled sufficiently precisely to ensure uniformity in the position, size, and shape of the apertures. The apertures in shaping aperture array 18 may be round, square, or other shape. The shaping aperture array 18 may be coated with a surface layer of a metal to prevent surface charging, and in one embodiment the metal is of a type which does not form a native-oxide skin layer, such as CrMo.

These apertures operate to shape each beamlet, by cutting off a peripheral portion of the beamlets striking the apertures. The resulting shaped beamlet will exhibit a more uniform dose distribution. The shaping aperture array 18 allows imaging of the apertures rather than of a virtual image of the beam source 1. With this addition, the system becomes less dependent on the position and magnitude of the spots created by focusing the beamlets on the plane of beam blanker array 6. This results in the system being less susceptible to variations or errors in the array of lens systems preceding the beam blanker array 6. However, the system thereby becomes more susceptible to variations in the dose of the beamlets.

The shaping aperture array 18 is preferably positioned in close vicinity to the beam blanker array 6, either before or preferably after array 6, and it may be used in a system without the group deflector array 6G.

FIG. 5 illustrates yet another embodiment of the same principle illustrated in the systems of FIGS. 3 and 4. In this embodiment, the aperture array 4 is manufactured to produce larger sub-beams 20A. The sub-beams 20A are demagnified by a first condenser lens array 5A focusing the sub-beams onto a common plane 19 and producing a cross-over per sub-beam at plane 19. A second condenser lens array 5B, located preferably immediately behind plane 19, produces focused sub-beams 20B focused towards the end module 7. It should be noted that the various condenser lens arrays in any of the embodiments may comprise a single condenser lens array or a set of condenser lens arrays, as would be known to a person of skill in the field of electron-optics.

The sub-beams 20B are intercepted by a shaping aperture array 18, which in this embodiment produces a plurality of projection beamlets 21 from each sub-beam 20B. These beamlets 21 pass through beamlet blanker array 6, the blanked beamlets being blocked by beam stop array 8. The unblanked beamlets in each group pass through a corresponding opening in beam stop array 8 and are subsequently projected onto the target by projection lens arrangement 10.

The embodiment shown in FIG. 5 has the advantage that the combination of lens 5A and 5B can be a rather weak lens (allowing for a relative long distance between condenser lens array 5B and end module 7) while lenses 5A and 5B individually can be rather strong. Lenses 5A and 5B are strong if, for example, beamlet energy is reduced between condenser lens array 5B and end module 7, which is beneficial for the strength of beamlet blanker 6. In another embodiment an array of apertures is placed at plane 19 to provide yet another degree of freedom to control the opening angle of beamlets 20B.

FIG. 6 illustrates yet another embodiment, being a variation of the system of FIG. 5 in which the sub-beams 20A are directly focused by condenser lens array 5 towards the end module 7. Compared to the embodiment of FIG. 5, this embodiment has the advantage of fewer components (omitting the extra condenser lens array 5B), a somewhat shorter column length, and less chromatic aberration due to absence of cross-over in the sub-beams 20A. However, this embodiment lacks the advantage of the embodiment of FIG. 5 of increased freedom in determining the opening angle of the sub-beams.

Figure 7:
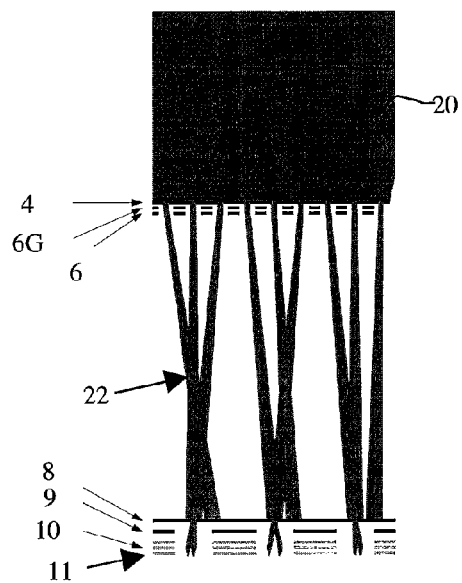
FIG. 7 is a simplified embodiment including a group deflection array.

FIG. 7 illustrates in an even more simplified version of the system, comprising an aperture array 4, immediately followed up by a group deflector array 6G and a beamlet blanker array 6, or vice versa.

Figure 8:
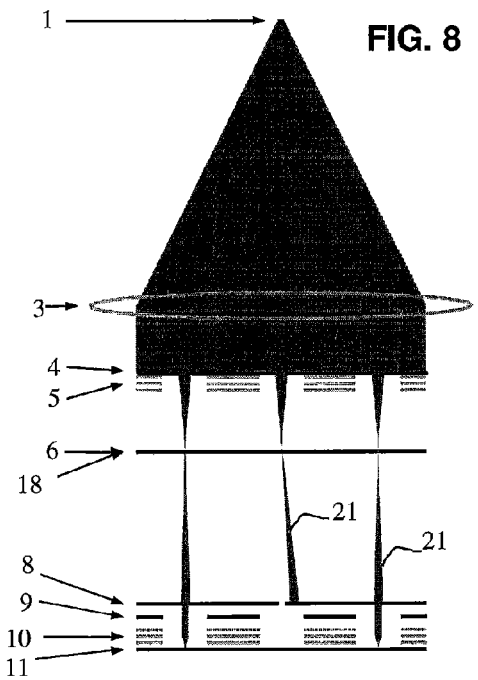
FIGS. 8 to 10 are alternative embodiments of the embodiments of FIG. 4 for a single beamlet per projection lens.
Figure 9:
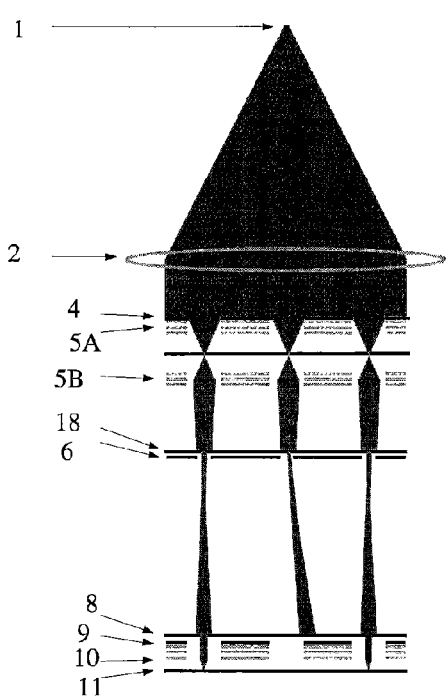
Figure 10:
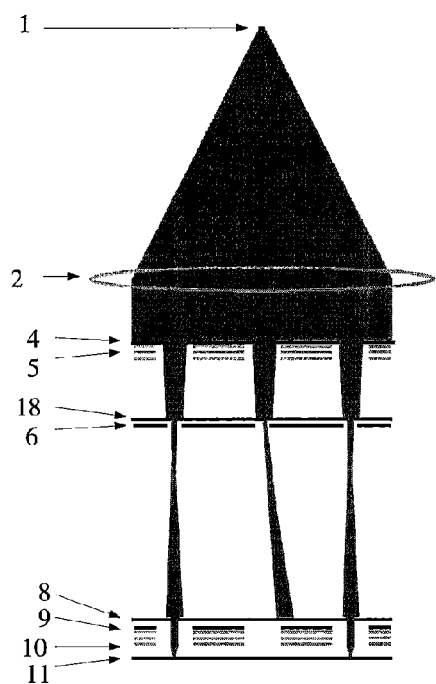

FIGS. 8 to 10 illustrate various alternative embodiments with non-patterned beamlets, i.e. single beamlet per projection lens systems. FIG. 8 comprises the system as shown in FIG. 1 with the addition of a shaping aperture array 18 located in the vicinity of (before or after) beamlet blanker array 6. FIG. 9 comprises the system as shown in FIG. 5 with the two condenser lens arrays 5A and 5B focusing sub-beams 20A and 20B respectively. However, only a single beamlet 21 is formed by shaping aperture array 18 from each sub-beam 20B. FIG. 10 comprises the system as shown in FIG. 6 with a single condenser lens arrays 5 focusing sub-beams 20A onto the end module 7. However, only a single beamlet 21 is formed by shaping aperture array 18 from each sub-beam 20A.

Figures 12, 12A, 12B:
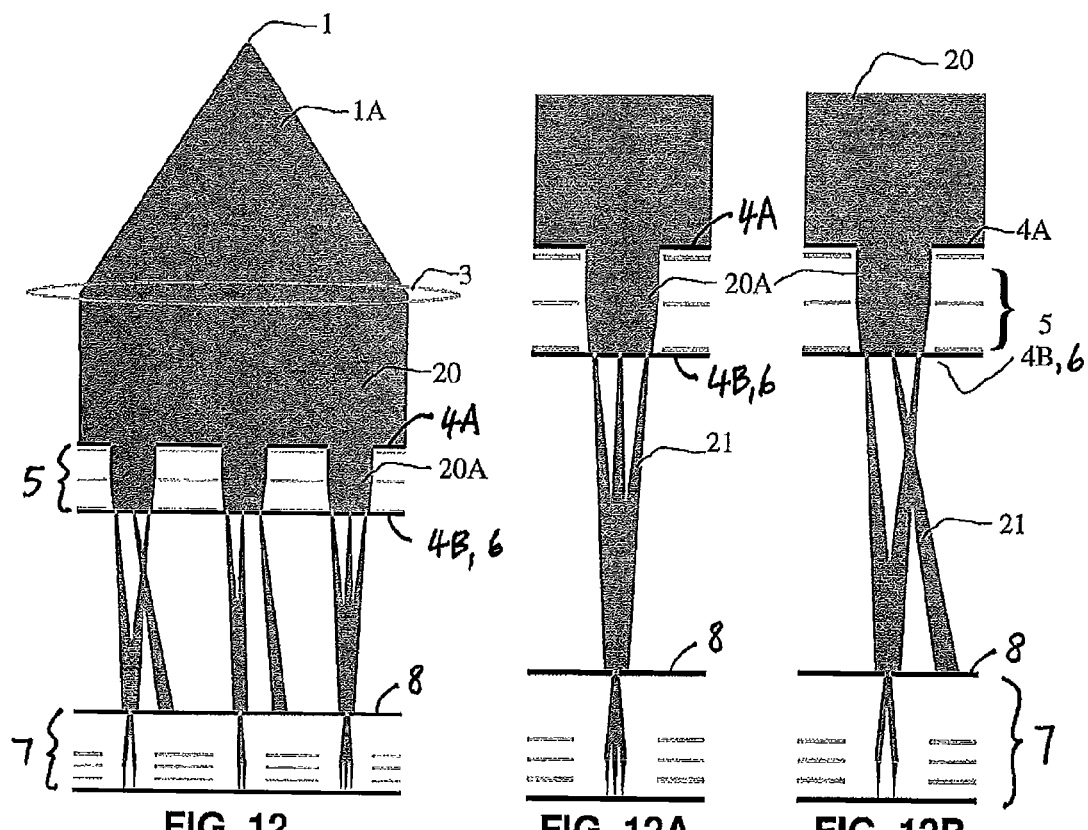
FIGS. 12, 12A and 12B illustrate a second simplified embodiment of the invention.

FIG. 12 illustrates yet another embodiment with aperture array 4A for creating sub-beams 20A and aperture array 4B for creating beamlets 21. A condenser lens array 5 (or a set of condenser lens arrays) is included behind sub-beam creating aperture array 4A, for focusing the sub-beams 20A towards a corresponding opening in the beam stop array 8 of end module 7. Beamlet creating aperture array 4B is preferably included in combination with a beamlet blanker array 6, i.e. arranged close together with array 4B before array 6 or the other way around.

As separately shown in FIG. 12A, the condenser lens or lenses 5 focus sub-beam 20A either in or towards a corresponding opening in beam stop array 8 of end module 7. In this example, the aperture array 4B produces three beamlets from sub-beam 20A, which strike the beam stop array 8 at a corresponding opening so that the three beamlets are projected onto the target by the projection lens system in end module 7. In practice a much larger number of beamlets may be produced by aperture array 4B for each projection lens system in end module 7. In a practical embodiment typically around 50 beamlets may be directed through a single projection lens system, and this may be increased to 200 or more. As shown in FIG. 12B, the beamlet blanker array 6 may deflect individual beamlets 21 in a group of beamlets at certain times in order to blank them. This is illustrated by blanked beamlet 22, which has been deflected to a location on the beam stop array 8 near to but not at an opening.

In a non-depicted variation of the FIG. 12 embodiment, the aperture plates 4A and 4B are preferably integrated in an integrated aperture plate 4AB for producing groups of beamlets 21. The condenser lens array 5 is preferably located behind the integrated aperture plate 4AB. This design advantageously provides a simple and economic means for realizing a multiple beamlet per projection lens system.

FIGS. 14 and 15 are schematic diagrams of systems designed to reduce problems of chromatic aberration of the collimator 3. One solution is to apply the technology as disclosed by US published patent application 2004/232349 of the Applicant of the present application, which is hereby incorporated by reference in its entirety. According to this solution, a lens array is included in the system between the source 1 and the collimator 3, to focus sub-beams in the main plane of collimator 3. A first effect of this measure is that the chromatic aberration of the collimator does not result in a blur of the virtual source. Instead, a "top hat" opening angle is convoluted with an aberration angle. A second effect is that if the sub-beams are imaged in the collimator main plane with sufficient demagnification, the opening angle is large, and thus the aberration angle is small with respect to the opening angle. The unusable or at least unfavorable angles can then be removed by an aperture down stream.

FIG. 14 illustrates a solution in which the virtual source is imaged on the target, using a single condenser lens array 5. This condenser lens array 5 is included within a diverging beam part, in close proximity to and behind a first aperture array 4A. The focused sub-beams thus created are projected on to a main plain of a collimator array 15, from where the sub-beams diverge in a collimated manner, here with parallel central axes, to a second aperture array 4B. The second aperture array 4B is constructed and/or located to truncate a peripheral part of the collimated sub-beams. A central part of these collimated sub-beams, showing a mostly uniform current distribution, continues to a third aperture array 4C, which finally creates beamlets 21 to be projected on the target 11 (unless blanked by beamlet blanker array 6). A group deflector array 6G and beamlet blanker array 6 is located behind the final aperture array 4C as described before, for directing groups of beamlets created by the final aperture array towards end module 7.

FIG. 15 illustrates an alternative to FIG. 14, including a more complex arrangement using two condenser arrays (5C and 5) and two collimator arrays (15A and 15B) but providing an improvement in overall transmission performance. Beamlets as created in an upper system part corresponding to that of FIG. 14, are subsequently collimated by collimator array 15B, so that the plurality of beamlets 21 created by the final aperture array 4C become parallel, i.e. the central axes of the beamlets become parallel. The collimated beamlets generated by final aperture array 4C and collimator array 15B are focused by condenser lens array 5, preferably located behind the collimator array 15B. Group deflector array 6G, followed by or preceded by beamlet blanker array 6, is located within or close to the focal plane of the focused and collimated beamlets.

Figure 16:
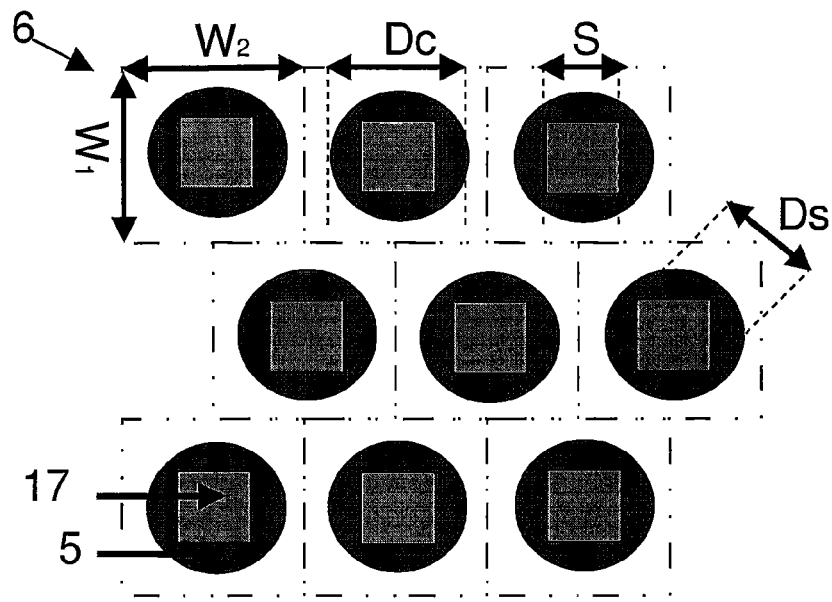
FIG. 16 is diagram showing a possible layout for a beamlet blanker array 6.
Figure 17:
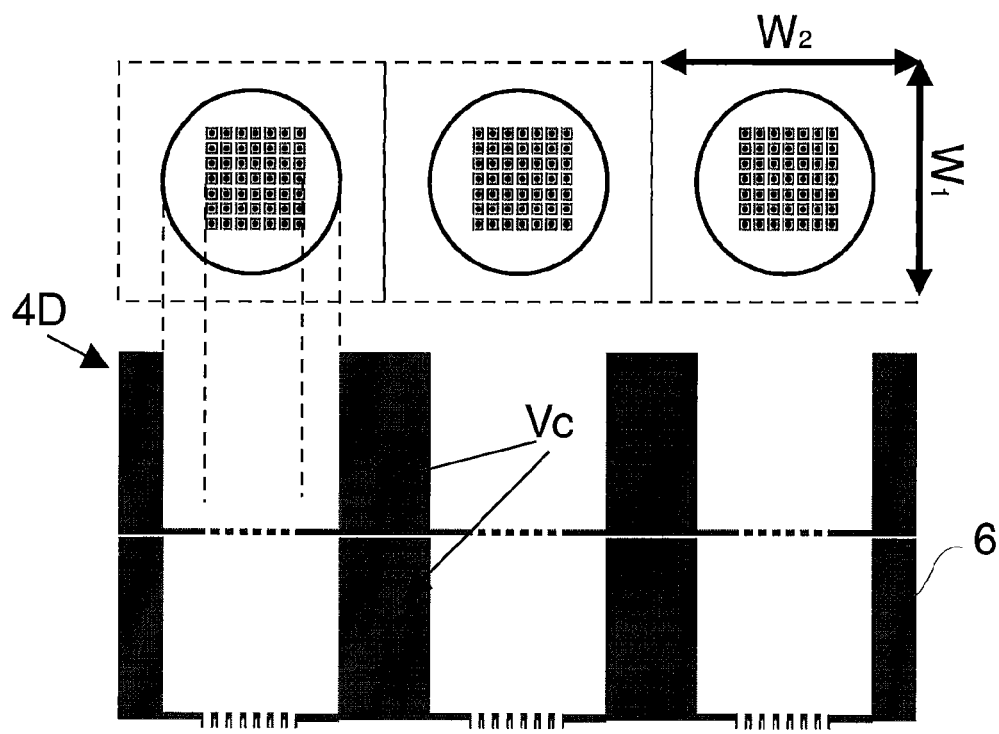
FIG. 17 illustrates an aperture array combined with a beamlet blanker array 6.

Certain additional aspects of the arrays used in the preceding embodiments are illustrated in FIGS. 16 and 17. FIG. 16 is diagram showing a possible layout for a beamlet blanker array 6, with an offset row or triangular arrangement of array apertures. The apertures in the condenser lens arrays, and the group deflector arrays in the various embodiments would also conform to this same arrangement, which directly corresponds to or mirrors the arrangement of the projection lens systems in the end module 7 in the so called projection slit of the system.

A deflector area 17 of a beamlet blanker array 6 is shown, indicated with a location relative to an aperture of a condenser lens array 5 preceding or following the blanker array, e.g. as in FIG. 12. Since in the present embodiments the condenser lenses are arranged typically with a very high filling factor, here around 80%, a sub beam aperture as in aperture array 4A in FIGS. 12, 12A and 12B, or the circular opening of an integrated aperture array 4D as in FIG. 17, would only be slightly smaller than that of condenser lens diameter Dc as projected here in combination with a blanker array 6. In this example the condenser lens opening has a diameter of 100 µm. The maximum deflector area 17 in this arrangement is determined by sides S of 56 µm by 56 µm, leading to a diametric or encircled measurement Ds of approximately 79 µm. For a 22 nm technology node, a reasonable number of pixels in a virtual grid for positioning the spots of the system could be 49, or 7 by 7, while geometric diameter of the spot size would be 24 nm, and a typical amount of demagnification at the projection lens system of end module 7 could, according to an embodiment here exemplified, be a factor of 100. With the triangular positioning of the beamlets in the system, the pitch of the available area to locate e.g. a blanker deflector is typically an area of W1 by W2, where in this example W1 is 130 µm and W2 is 150 µm. A practical number of beamlets per lens, alternatively denoted spots or sub-beamlets, could however amount to 200 or more. In practice this number is made 196 beamlets, arranged in an array of 14 by 14 beamlets.

FIG. 17 illustrates a preferred combination of an integrated aperture array 4D with a beamlet blanker array 6. The upper portion of FIG. 17 shows a top view of the integrated aperture array 4D. The integrated aperture array is designed with the same dimension constraints as the beamlet blanker array 6 in FIG. 16, with a field of dimensions W1 by W2. Each field comprises a field of 49 beamlet apertures, which are schematically represented in groups of 7 by 7. The lower portion of FIG. 17 shows a side view of the integrated aperture array 4D and beamlet blanker array 6. Both the integrated aperture array 4D and the beamlet blanker array 6 are according to further preference constructed with a thick plate provided with a single large aperture for each group of beamlets, and a thin array plate having multiple smaller apertures for each individual beamlet in each group. These thick and thin plates may either be two separate, connected plates, or a single plate in which the large apertures are first formed, followed by the small apertures. The large apertures preferably form vertical walls Vc surrounding the group of smaller apertures, the large aperture and group of smaller apertures preferably arranged coaxially as shown.

The thin array plate for the beamlet blanker array 6 includes the switching or blanker electrodes. The beamlet rendering apertures of array 4D are slightly smaller than the apertures of the beamlet blanker array 6. In accordance with a further embodiment of the invention, the aperture array 4D and beamlet blanker array 6 are integrated in a single array. This further integration has the advantage of a further reduction of the number of optical elements within the system column, but has the disadvantage that it is more difficult to manufacture while maintaining the highly precise and highly uniform apertures of an integrated aperture array.

Additional aspects of the present invention are further defined in a maskless lithographic system for exposing a target using a plurality of beamlets, said system comprising: a beamlet generator for generating a plurality of beamlets; a beamlet blanker for controllably blanking beamlets; an array of projection lens systems for projecting beamlets on to a surface of the target, wherein the beamlet generator comprises: at least one charged particle source for generating a charged particle beam; a sub-beam generator defining a plurality of sub-beams from the charged particle beam, and a beamlet generator defining a group of individual beamlets from each of the sub-beams. The maskless lithographic system may further comprise a sub-beam manipulator array for influencing said subbeams. The sub-beam manipulator array may be an array of sub-beam truncators for truncating a first part of a sub-beam and letting continue a second part of the sub-beam. The truncator may truncate a peripheral part of the sub-beam, while a central part of the sub-beam continues. The sub-beam manipulator array may comprise a collimator array for collimating the sub-beams. The system may comprise beam and sub-beams diverging up to the collimator array.

The system may further comprise an additional collimator array for collimating the beamlets. The sub-beam manipulator array may comprise a condenser lens array, each condenser lens in the array influencing one of the sub-beams. The condenser lens may manipulate the sub-beam to converge the sub-beam towards a common point of convergence. The sub-beam may be converged towards a point corresponding to one of the projection lens systems after division into beamlets. The sub-beam manipulator array may be adapted for converging groups of beamlets originating from a sub-beam towards a common point of convergence for each group, the common point of convergence optionally being a point corresponding to one of the projection lens systems. The number of sub-beams generated from the beam may be in the range between 5,000 and 50,000. The number of beamlets generated from the sub-beams may be in the range between 2 and 10,000. The projection lens systems may be located in a vicinity of the target surface, such that a distance between a source side of the projection lens system and the beamlet generator is larger than a distance between the source side and the target surface. The aperture arrays may be used for the creation of the sub-beams and the creation of the beamlets.

The present invention also encompasses a method of exposing a target using a plurality of beamlets, the method comprising: generating a plurality of beamlets; controllably blanking beamlets; projecting beamlets on to a surface of the target, wherein the generation of beamlets comprises: generating a charged particle beam; defining a plurality of sub-beams from the charged particle beam, and defining groups of individual beamlets from the sub-beams. The method may further comprise the step of optically manipulating the sub-beams. The optical manipulation may include converging the sub-beam to a point of convergence. The point of convergence may be located at a point after splitting the sub-beams into individual beamlets, the point of convergence being a common point of convergence for the group of beamlets generated from the sub-beam and optionally being a point corresponding to one of the projection lens systems. The method may further comprise the step of groupwise manipulating the beamlets created from a single sub-beam.

The present invention also includes a method of exposing a target using a plurality of beamlets, the method comprising: generating a charged particle beam; defining separate beamlets or sub-beams from the generated beam; converging groups of beamlets towards a common point of convergence for each group; controllably blanking beamlets to generate patterned beamlets; and projecting the patterned beamlets onto the surface of the target; wherein each group of beamlets is converged towards a point corresponding to a projection lens system in use for projecting the patterned beamlets onto the surface of the target.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

What is claimed is:

1. A charged particle multi-beamlet system for exposing a target using a plurality of beamlets, the system comprising:
   at least one charged particle source for generating a charged particle beam;
   an aperture array defining separate beamlets from the generated beam;
   a beamlet manipulator for converging groups of the beamlets towards a common point of convergence for each group;
   a beamlet blanker for controllably blanking beamlets in the groups of beamlets; and
   an array of projection lens systems for projecting unblanked beamlets of the groups of beamlets on to the surface of the target,
   wherein the beamlet manipulator is adapted to converge each of the groups of beamlets towards a point corresponding to one of the projection lens systems; and
   wherein the beamlet manipulator comprises a condenser lens array and a shaping aperture array.

2. The system of claim 1, wherein the aperture array is adapted for defining sub-beams and the shaping aperture array is adapted for producing a plurality of beamlets, and wherein the condenser lens array is adapted for focusing each sub-beam at a point corresponding to a projection lens system.

3. The system of claim 1, wherein the aperture array is adapted for defining sub-beams and the shaping aperture array comprises apertures for producing a plurality of beamlets from each sub-beam, the unblanked beamlets of the plurality of beamlets converging on a point corresponding to a projection lens system.

4. The system of claim 1, wherein the aperture array is adapted for defining sub-beams and the shaping aperture array is adapted for creating beamlets, the aperture array and the shaping aperture array being integrated into a single unit.

5. The system of claim 1, wherein the beamlet manipulator comprises a further condenser lens array.

6. The system of claim 5, wherein the aperture array is adapted for defining sub-beams and the shaping aperture array is adapted for producing a plurality of beamlets, and wherein the condenser lens array is adapted for focusing the sub-beams at a common plane before the further condenser lens array, and the further condenser lens array is adapted for focusing each sub-beam at a point corresponding to one of the projection lens systems.

7. The system of claim 5, wherein the aperture array is adapted for defining sub-beams and the shaping aperture array comprises apertures for producing a plurality of beamlets from each sub-beam focused by the second condenser lens array, the unblanked beamlets of the plurality of beamlets converging on a point corresponding to one of the projection lens systems.

8. A charged particle multi-beamlet system for exposing a target using a plurality of beamlets, the system comprising:
   at least one charged particle source for generating a charged particle beam;
   a first aperture array for creating sub-beams from the generated beam;
   a condenser lens array for focusing the sub-beams;
   a second aperture array for creating a plurality of beamlets from each focused sub-beam;
   a beamlet blanker for controllably blanking beamlets; and
   an array of projection lens systems for projecting beamlets on to the surface of the target, wherein the condenser lens array is adapted for focusing each sub-beam at a point corresponding to one of the projection lens systems.

9. The system of claim 8, wherein the second aperture array is combined with the beamlet blanker.

10. A charged particle multi-beamlet system for exposing a target using a plurality of beamlets, the system comprising:
    at least one charged particle source for generating a charged particle beam;
    a first aperture array for creating sub-beams from the generated beam;
    a second aperture array for creating a plurality of beamlets from each focused sub-beam;
    a condenser lens array for focusing the beamlets;
    a beamlet blanker for controllably blanking beamlets; and
    an array of projection lens systems for projecting beamlets on to the surface of the target, wherein the condenser lens array is adapted for focusing the beamlets formed from each sub-beam at a point corresponding to one of the projection lens systems.

11. The system of claim 10, wherein the first and second aperture arrays are integrated into a single unit.

12. The system of claim 11, wherein the first aperture array comprises comparatively large apertures and the second aperture array comprises a group of comparatively small apertures corresponding to each large aperture in the first aperture array, the walls of the large apertures extending upwardly from a plane of the second aperture array.

13. The system of claim 12, wherein the walls of the large apertures enclose an area accommodating the group of small apertures of the second aperture array.

14. The system of claim 12, wherein the walls of the large apertures extend upwards to a considerable extend in comparison to the thickness of the second aperture array.

* * * * *